US011393793B2

(12) United States Patent
Kim

(10) Patent No.: US 11,393,793 B2
(45) Date of Patent: Jul. 19, 2022

(54) THIN SEMICONDUCTOR PACKAGE

(71) Applicant: SAMSUNG ELECTRONICS CO., LTD., Suwon-si (KR)

(72) Inventor: Bongsoo Kim, Sejong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 57 days.

(21) Appl. No.: 16/916,678

(22) Filed: Jun. 30, 2020

(65) Prior Publication Data

US 2021/0210465 A1 Jul. 8, 2021

(30) Foreign Application Priority Data

Jan. 2, 2020 (KR) ........................ 10-2020-0000485

(51) Int. Cl.
*H01L 25/065* (2006.01)
*H01L 23/522* (2006.01)
*H01L 23/10* (2006.01)
*H01L 23/538* (2006.01)

(52) U.S. Cl.
CPC .......... *H01L 25/0657* (2013.01); *H01L 23/10* (2013.01); *H01L 23/5223* (2013.01); *H01L 23/5384* (2013.01); *H01L 23/5386* (2013.01)

(58) Field of Classification Search
CPC ..................................................... H01L 23/66
See application file for complete search history.

(56) References Cited

U.S. PATENT DOCUMENTS

| 9,368,460 | B2 | 6/2016 | Yu et al. |
| 9,570,322 | B2 | 2/2017 | Su et al. |
| 9,601,463 | B2 | 3/2017 | Yu et al. |
| 9,633,974 | B2 | 4/2017 | Zhai et al. |
| 10,115,647 | B2 | 10/2018 | Huang et al. |
| 10,424,550 | B2 | 9/2019 | Chiang et al. |
| 2019/0139876 | A1 | 5/2019 | Lee et al. |
| 2019/0189572 | A1* | 6/2019 | Chiang ............... H01Q 1/2283 |

FOREIGN PATENT DOCUMENTS

CN 104051287 A 9/2014

* cited by examiner

*Primary Examiner* — William A Harriston
(74) *Attorney, Agent, or Firm* — Volentine, Whitt & Francos, PLLC

(57) ABSTRACT

A semiconductor package includes; a lower connection structure, a semiconductor chip on the lower connection structure, an intermediate connection structure on the lower connection structure, a sealing layer covering the semiconductor chip, and an upper connection structure including a first upper insulating layer on the sealing layer, a first upper conductive pattern layer on the first upper insulating layer, and a first upper via penetrating the first upper insulating layer to directly connect the first upper conductive pattern layer to the intermediate connection structure. A height from an upper surface of the lower connection structure to an upper surface of the sealing layer is less than or equal to a maximum height from the upper surface of the lower connection structure to an upper surface of the intermediate connection structure.

19 Claims, 17 Drawing Sheets

THIN SEMICONDUCTOR PACKAGE

CROSS-REFERENCE TO RELATED APPLICATION

This application claims the benefit of Korean Patent Application No. 10-2020-0000485, filed on Jan. 2, 2020 in the Korean Intellectual Property Office, the subject matter of which is hereby incorporated by reference.

BACKGROUND

The inventive concept relates to semiconductor packages. More particularly, the inventive concept relates to fan-out type semiconductor packages.

Improvement in the performance of a semiconductor package may be realized by increasing the number of its external connection terminals. However, increasing the number of external connection terminals generally increases the planar area occupied by the semiconductor package. Yet, reduction in the manufacturing costs of a semiconductor package may be realized by reducing the planar area and overall size of the semiconductor package. However, efforts to reduce the size of a semiconductor chip must ensure a sufficiently large planar area to accommodate an increased number of external connection terminals. A fan-out package connecting the semiconductor chip to the external connection terminals may be used to effectively provide a planar area for connecting external connection terminals that is greater than the planar area of the semiconductor chip.

SUMMARY

The inventive concept provides semiconductor packages including an upper connection structure of high pattern density, and yet having a relatively thin thickness and reduced manufacturing cost.

According to an embodiment of the inventive concept, there is provided a semiconductor package including; a lower connection structure; a semiconductor chip on an upper surface of the lower connection structure, an intermediate connection structure on the upper surface of the lower connection structure, a sealing layer covering an upper surface of the semiconductor chip, and an upper connection structure including a first upper insulating layer on an upper surface of the sealing layer, a first upper conductive pattern layer on an upper surface of the first upper insulating layer, and a first upper via penetrating the first upper insulating layer to directly connect the first upper conductive pattern layer to the intermediate connection structure, wherein a height from the upper surface of the lower connection structure to the upper surface of the sealing layer may be less than or equal to a maximum height from the upper surface of the lower connection structure to an upper surface of the intermediate connection structure.

According to another embodiment of the inventive concept, there is provided a semiconductor package including; a lower semiconductor package, an upper semiconductor package on the lower semiconductor package, and an inter-package connection member between the lower semiconductor package and the upper semiconductor package, wherein the lower semiconductor package includes; a first connection structure, a first semiconductor chip on the first connection structure, a second connection structure on the of the first connection structure, a first sealing layer on the first semiconductor chip, and a third connection structure including an insulating layer on the first sealing layer and the second connection structure, a conductive pattern layer on the insulating layer, and a via penetrating the insulating layer and having an upper end in contact with conductive pattern layer and a lower end in contact with the second connection structure, a length from the lower end of the via to the upper end of the via is less than or equal to a maximum thickness of the insulating layer, the upper semiconductor package includes: a fourth connection structure; a second semiconductor chip on the fourth connection structure; and a second sealing layer on the fourth connection structure and the second semiconductor chip, and the inter-package connection member connects the conductive pattern layer of the third connection structure to the fourth connection structure.

According to another embodiment of the inventive concept, there is provided a semiconductor package including; a semiconductor chip, an intermediate connection structure including an intermediate insulating layer around the semiconductor chip, an intermediate conductive pattern layer on the intermediate insulating layer, and an intermediate via penetrating the intermediate insulating layer to be connected to the intermediate conductive pattern layer, a lower connection structure including a lower insulating layer on a lower surface of the semiconductor chip and a lower surface of the intermediate connection structure, a lower via penetrating the lower insulating layer to be connected to the intermediate via, and a lower pad disposed on a lower surface of the lower insulating layer and connected to the lower via; an external connection terminal on a lower surface of the lower pad, a sealing layer covering an upper surface of the semiconductor chip and exposing the intermediate conductive pattern layer, and an upper connection structure including a first upper insulating layer on the sealing layer, a first upper conductive pattern layer on the first upper insulating layer, and a first upper via penetrating the first upper insulating layer to connect the first upper conductive pattern layer to the intermediate conductive pattern layer, wherein an upper surface of the intermediate conductive pattern layer is coplanar with an upper surface of the sealing layer or protrudes upward from the upper surface of the sealing layer.

BRIEF DESCRIPTION OF THE DRAWINGS

Embodiments of the inventive concept will be more clearly understood from the following detailed description taken in conjunction with the accompanying drawings in which.

DETAILED DESCRIPTION

Figure 1:
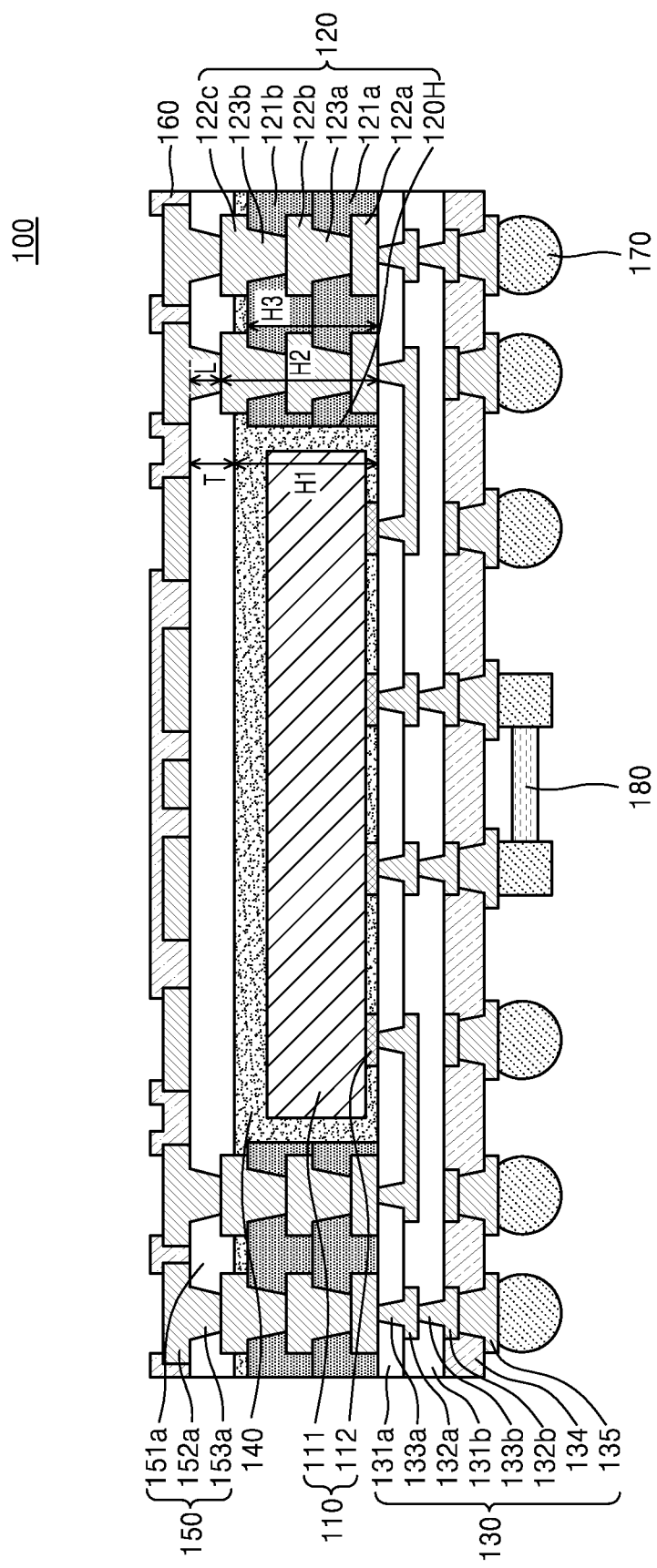
FIGS. 1, 2, 3, 4, 5, and 6 are respective cross-sectional views of semiconductor packages according to embodiments of the inventive concept.

Certain embodiments of the inventive concept will now be described in some additional detail with reference to the accompanying drawings. Throughout the written description and drawings, like reference numbers and labels are used to denote like or similar elements.

Hereinafter, examples of a lower connection structure 130, an intermediate connection structure 120, and an upper connection structure 150 will be described with reference to the drawings. Various assemblies including at least one of the lower connection structure 130, the intermediate connection structure 120, and the upper connection structure 150 may be referred to as a "connection structure."

One or more of first and second lower insulating layers 131a and 131b, first and second intermediate insulating layers 121a and 121b, and a first upper insulating layer 151a may hereafter be referred to as an "insulating layer."

One or more of first and second lower conductive pattern layers 132a and 132b, first, second, and third intermediate conductive pattern layers 122c, 122b, and 122a, and a first upper conductive pattern layer 152a may be referred to as a "conductive pattern layer."

One or more of first and second lower vias 133a and 133b, first and second intermediate vias 132a and 132b, and a first upper via 153a may be referred to as a "via."

Figure (FIG. 1 is a cross-sectional view of a semiconductor package 100 according to embodiments of the inventive concept.

Referring to FIG. 1, the semiconductor package 100 may include the lower connection structure 130, a first semiconductor chip 110 on an upper surface of the lower connection structure 130, the intermediate connection structure 120 on the upper surface of the lower connection structure 130, a first sealing layer 140 covering at least an upper surface of the first semiconductor chip 110, and the upper connection structure 150 on the first sealing layer 140. According to some embodiments of the inventive concept, the semiconductor package 100 may further include an upper protective layer 160 on the upper connection structure 150. According to some embodiments of the inventive concept, the semiconductor package 100 may further include an external connection terminal 170 and/or a capacitor 180 on a lower surface of the lower connection structure 130.

The lower connection structure 130 may be configured to connect the first semiconductor chip 110 to the external connection terminal 170, connect the intermediate connection structure 120 to the first semiconductor chip 110, and connect the intermediate connection structure 120 to the external connection terminal 170. The lower connection structure 130 may include at least one lower insulating layer (e.g., the first and second lower insulating layers 131a and 131b), at least one lower conductive pattern layer (e.g., the first and second lower conductive pattern layers 132a and 132b), on the at least one lower insulating layer (e.g., the first and second lower insulating layers 131a and 131b), and at least one lower via (e.g., the first and second lower vias 133a and 133b) in contact with the at least one lower conductive pattern layer (e.g., the first and second lower conductive pattern layers 132a and 132b) by penetrating the at least one lower insulating layer (e.g., the first and second lower insulating layers 131a and 131b). The at least one lower conductive pattern layer (e.g., the first and second lower conductive pattern layers 132a and 132b), and the at least one lower via (e.g., the first and second lower vias 133a and 133b) may provide an electrical path connecting the first semiconductor chip 110 to the external connection terminal 170, an electrical path connecting the intermediate connection structure 120 to the first semiconductor chip 110, and an electrical path connecting the intermediate connection structure 120 to the external connection terminal 170. According to some embodiments of the inventive concept, the lower connection structure 130 may further include a lower protective layer 134 and a lower pad 135 on the lower protective layer 134. The lower connection structure 130 may include a redistribution structure or a printed circuit board (PCB).

For example, the lower connection structure 130 may include the first lower insulating layer 131a on a lower surface of the first semiconductor chip 110 and a lower surface of the intermediate connection structure 120, the first lower conductive pattern layer 132a on a lower surface of the first lower insulating layer 131a, the first lower via 133a in contact with the first lower conductive pattern layer 132a by penetrating the first lower insulating layer 131a, the second lower insulating layer 131b on the lower surface of the first lower insulating layer 131a and on a lower surface of the first lower conductive pattern layer 132a, the second lower conductive pattern layer 132b on a lower surface of the second lower insulating layer 131b, and the second lower via 133b penetrating the second lower insulating layer 131b and extending between the first lower conductive pattern layer 132a and the second lower conductive pattern layer 132b. Alternately, the lower connection structure 130 may include more or less than two lower conductive pattern layers. The first lower conductive pattern layer 132a may be connected to the third intermediate conductive pattern layer 122a of the intermediate connection structure 120 and a chip pad 112 of the first semiconductor chip 110 through the first lower via 133a, and the second lower conductive pattern layer 132b may be connected to the first lower conductive pattern layer 132a through the second lower via 133b.

The first and second lower insulating layers 131a and 131b may include, for example, an inorganic insulating material, an organic insulating material, or a combination thereof. The inorganic insulating material may include, for example, silicon oxide, silicon nitride, or a combination thereof. The organic insulating material may include, for example, polyimide, epoxy resin, or a combination thereof. The first and second lower conductive pattern layers 132a and 132b and the first and second lower vias 133a and 133b may include a conductive material which may include, for example, copper (Cu), gold (Au), silver (Ag), nickel (Ni), tungsten (W), aluminum (Al), or a combination thereof. According to some embodiments of the inventive concept, the first and second lower conductive pattern layers 132a and 132b and the first and second lower vias 133a and 133b may further include a barrier material to prevent the conductive material from diffusing outward therefrom. The barrier material may include, for example, titanium (Ti), tantalum (Ta), titanium nitride (TiN), tantalum nitride (TaN), or a combination thereof.

The lower protective layer 134 may be on the lower surface of the second lower insulating layer 131b. The lower protective layer 134 may physically and/or chemically protect the lower connection structure 130 from an ambient environment. According to some embodiments of the inventive concept, the lower protective layer 134 may include a composite material. That is, the lower protective layer 134 may include a matrix and a filler inside the matrix. The matrix may include a polymer, and the filler may include silica, titania, or a combination thereof.

The lower pad 135 may be on a lower surface of the lower protective layer 134 and in contact with the second lower conductive pattern layer 132b by penetrating the lower protective layer 134, so that the lower pad 135 connects the second lower conductive pattern layer 132b to the external connection terminal 170. The lower pad 135 may include a conductive material which may include, for example, Cu, Au, Ag, Ni, W, Al, or a combination thereof. According to some embodiments of the inventive concept, the lower pad 135 may further include a barrier material to prevent the conductive material from diffusing outward therefrom. The barrier material may include, for example, Ti, Ta, TiN, TaN, or a combination thereof. According to some embodiments of the inventive concept, the lower pad 135 may further include a wetting material to improve wettability between the conductive material and the external connection terminal 170. When the conductive material includes Cu, the wetting material may include Ni, Au, or a combination thereof.

The first semiconductor chip 110 may include a body 111 and the chip pad 112 on a lower surface of the body 111. The body 111 may include a substrate and an integrated circuit on the substrate. A surface of the first semiconductor chip 110, on which the integrated circuit is formed, may be referred to as an active surface, and a surface of the first semiconductor chip 110, opposing the active surface may be referred to as an inactive surface. In FIG. 1, the active surface of the first semiconductor chip 110 may be the lower surface of the first semiconductor chip 110, and the inactive surface may be the upper surface of the first semiconductor chip 110.

The substrate may include a semiconductor material, e.g., a Group IV semiconductor material, a Group III-V semiconductor material, a Group II-VI semiconductor material, or a combination thereof. The Group IV semiconductor material may include, for example, silicon (Si), germanium (Ge), or a combination thereof. The Group III-V semiconductor material may include, for example, gallium arsenide (GaAs), indium phosphide (InP), gallium phosphide (GaP), indium arsenide (InAs), indium antimonide (InSb), indium gallium arsenide (InGaAs), or a combination thereof. The Group II-VI semiconductor material may include, for example, zinc telluride (ZnTe), cadmium sulfide (CdS), or a combination thereof. The integrated circuit may be any type of integrated circuit including a memory circuit, a logic circuit, or a combination thereof. The memory circuit may include, for example, a dynamic random access memory (DRAM) circuit, a static random access memory (SRAM) circuit, a flash memory circuit, an electrically erasable and programmable read-only memory (EEPROM) circuit, a phase-change random access memory (PRAM) circuit, a magnetic random access memory (MRAM) circuit, a resistive random access memory (RRAM) circuit, or a combination thereof. The logic circuit may include, for example, a central processing unit (CPU) circuit, a graphics processing unit (GPU) circuit, a controller circuit, an application specific integrated circuit (ASIC), an application processor (AP) circuit, or a combination thereof.

The chip pad 112 may be on the lower surface of the first semiconductor chip 110. The chip pad 112 may connect the integrated circuit of the body 111 to the lower connection structure 130. The chip pad 112 of the first semiconductor chip 110 may be electrically connected to the upper connection structure 150 through the lower connection structure 130 and the intermediate connection structure 120. The chip pad 112 may include a conductive material which may include, for example, Cu, Au, Ag, Ni, W, Al, or a combination thereof.

The intermediate connection structure 120 may be between the lower connection structure 130 and the upper connection structure 150, and may be configured to connect the lower connection structure 130 to the upper connection structure 150. The intermediate connection structure 120 may be disposed around (e.g., at least partially surrounding) the first semiconductor chip 110. According to some embodiments of the inventive concept, the intermediate connection structure 120 may include a hole, and the first semiconductor chip 110 may be in the hole 120H of the intermediate connection structure 120. That is, the intermediate connection structure 120 may at least partially encompass the first semiconductor chip 110.

The intermediate connection structure 120 may include at least one intermediate via (e.g., first and second intermediate vias 123b and 123a) configured to connect the lower connection structure 130 to the upper connection structure 150. According to some embodiments of the inventive concept, the intermediate connection structure 120 may further include at least one intermediate insulating layer (e.g., first and second intermediate insulating layers 121b and 121a) which the at least one intermediate via penetrates. According to some embodiments of the inventive concept, the intermediate connection structure 120 may further include a plurality of intermediate conductive pattern layers (e.g., the first, second, and third intermediate conductive pattern layers 122c, 122b, and 122a) disposed on the at least one intermediate insulating layer (e.g., the first and second intermediate insulating layers 121b and 121a) and connected to each other by the at least one intermediate via (e.g., the first and second intermediate vias 123b and 123a). The at least one intermediate via (e.g., the first and second intermediate vias 123b and 123a) and the plurality of intermediate conductive pattern layers (e.g., the first, second, and third intermediate conductive pattern layers 122c, 122b, and 122a) may provide an electrical path connecting the lower connection structure 130 to the upper connection structure 150.

For example, the intermediate connection structure 120 may include the first intermediate insulating layer 121b above an upper layer of the lower connection structure 130, the first intermediate conductive pattern layer 122c on an upper layer of the first intermediate insulating layer 121b and in contact with the first upper via 153a, the first intermediate via 123b in contact with the first intermediate conductive pattern layer 122c by penetrating the first intermediate insulating layer 121b, the second intermediate insulating layer 121a between the lower connection structure 130 and the first intermediate insulating layer 121b, the second intermediate conductive pattern layer 122b between the second intermediate insulating layer 121a and the first intermediate insulating layer 121b and in contact with the first intermediate via 123b, the second intermediate via 123a in contact with the second intermediate conductive pattern layer 122b by penetrating the second intermediate insulating layer 121a, and the third intermediate conductive pattern layer 122a between the lower connection structure 130 and the second intermediate insulating layer 121a and in contact with the second intermediate via 123a. Alternately, the intermediate connection structure 120 may include more or less than three conductive pattern layers. The second intermediate via 123a may connect the third intermediate conductive pattern layer 122a to the second intermediate conductive pattern layer 122b, and the first intermediate via 123b may connect the second intermediate conductive pattern layer 122b to the first intermediate conductive pattern layer 122c. The third intermediate conductive pattern layer 122a may be in contact with the first lower via 133a of the lower connection structure 130, and the first intermediate conductive pattern layer 122c may be in contact with the first upper via 153a of the upper connection structure 150.

According to some embodiments of the inventive concept, a height H2 from the upper surface of the lower connection structure 130 to an upper surface of the first intermediate conductive pattern layer 122c may be greater than a height H3 from the upper surface of the lower connection structure 130 to an upper surface of the first intermediate insulating layer 121b. The height H2 from the upper surface of the lower connection structure 130 to an upper surface of the first intermediate conductive pattern layer 122c may correspond to a maximum height from the upper surface of the lower connection structure 130 to an upper surface of the intermediate connection structure 120.

The first and second intermediate insulating layers 121b and 121a may include an insulating material. The insulating material may include a thermosetting resin such as an epoxy resin, a thermoplastic resin such as polyimide, or an insulating material (e.g., a prepreg, an Ajinomoto build-up film (ABF), FR-4, bismaleimide triazine (BT), or the like, in which resin is impregnated into a core material such as an inorganic filler and/or a glass fiber (a glass cloth or a glass fabric)). The first, second, and third intermediate conductive pattern layers 122c, 122b, and 122a and the first and second intermediate vias 123b and 123a may include a conductive material (e.g., Cu, Au, Ag, Ni, W, Al, or a combination thereof). According to some embodiments of the inventive concept, the first, second, and third intermediate conductive pattern layers 122c, 122b, and 122a and the first and second intermediate vias 123b and 123a may further include a barrier material (e.g., Ti, Ta, TiN, TaN, or a combination thereof) that prevents the conductive material from diffusing outward.

The first sealing layer 140 may expose the intermediate connection structure 120 while covering the upper surface of the first semiconductor chip 110. The first sealing layer 140 may at least partially fill a space between the first semiconductor chip 110 and the upper connection structure 150. According to some embodiments of the inventive concept, the first sealing layer 140 may further at least partially fill a space between the intermediate connection structure 120 and the first semiconductor chip 110. According to some embodiments of the inventive concept, the first sealing layer 140 may further at least partially fill in a space between the lower connection structure 130 and the first semiconductor chip 110. Where certain embodiments of the inventive concept in which the height H2 from the upper surface of the lower connection structure 130 to the upper surface of the first intermediate conductive pattern layer 122c is greater than the height H3 from the upper surface of the lower connection structure 130 to the upper surface of the first intermediate insulating layer 121b, the first sealing layer 140 may further at least partially fill a space between the upper surface of the first intermediate insulating layer 121b and a lower surface of the first upper insulating layer 151a.

A height H1 from the upper surface of the lower connection structure 130 to an upper surface of the first sealing layer 140 may be less than the height H2 from the upper surface of the lower connection structure 130 to the upper surface of the intermediate connection structure 120. That is, the height H1 from the upper surface of the lower connection structure 130 to the upper surface of the first sealing layer 140 may be less than the height H2 from the upper surface of the lower connection structure 130 to the upper surface of the first intermediate conductive pattern layer 122c. In other words, the upper surface of the intermediate connection structure 120 (e.g., the upper surface of the first intermediate conductive pattern layer 122c) may extend or protrude upward from the upper surface of the first sealing layer 140.

The first sealing layer 140 may not contact with the upper surface of the first intermediate conductive pattern layer 122c. In some embodiment in which the height H1 from the upper surface of the lower connection structure 130 to the upper surface of the first sealing layer 140 is greater than a height H3 from the upper surface of the lower connection structure 130 to the upper surface of the first intermediate insulating layer 121b, the first sealing layer 140 may contact a side surface of the first intermediate conductive pattern layer 122c. Alternately, in some embodiment in which the height H1 from the upper surface of the lower connection structure 130 to the upper surface of the first sealing layer 140 is less than or equal to the height H3 from the upper surface of the lower connection structure 130 to the upper surface of the first intermediate insulating layer 121b, the first sealing layer 140 may not contact the side surface of the first intermediate conductive pattern layer 122c.

The first sealing layer 140 may include, for example, a thermosetting resin such as an epoxy resin or a thermoplastic resin such as polyimide. Alternatively, the first sealing layer 140 may include a molding material such as an epoxy mold compound (EMC) or a photosensitive material such as a photo-imageable encapsulant (PIE). According to some embodiments of the inventive concept, the first sealing layer 140 may include a composite material including a matrix and a filler inside the matrix. The matrix may include a polymer, and the filler may include silica, titania, or a combination thereof.

The upper connection structure 150 may be configured to be connected to the intermediate connection structure 120. The upper connection structure 150 may include the first upper insulating layer 151a on an upper surface of the first sealing layer 140, the first upper conductive pattern layer 152a on an upper surface of the first upper insulating layer 151a, and the first upper via 153a penetrating the first upper insulating layer 151a and extending between the first upper conductive pattern layer 152a and the first intermediate conductive pattern layer 122c of the intermediate connection structure 120. The upper connection structure 150 may be a redistribution structure. According to some embodiments of the inventive concept, the first upper via 153a may directly electrically connect the first upper conductive pattern layer 152a to the first intermediate conductive pattern layer 122c of the intermediate connection structure 120. That is, an electrical path between the first upper conductive pattern layer 152a to the first intermediate conductive pattern layer 122c of the intermediate connection structure 120 may be formed only by the first upper via 153a. According to some embodiments of the inventive concept, a length 'L' from a lower end of the first upper via 153a to an upper end of the first upper via 153a may be less than a maximum thickness 'T' of the first upper insulating layer 151a.

Figure 6:
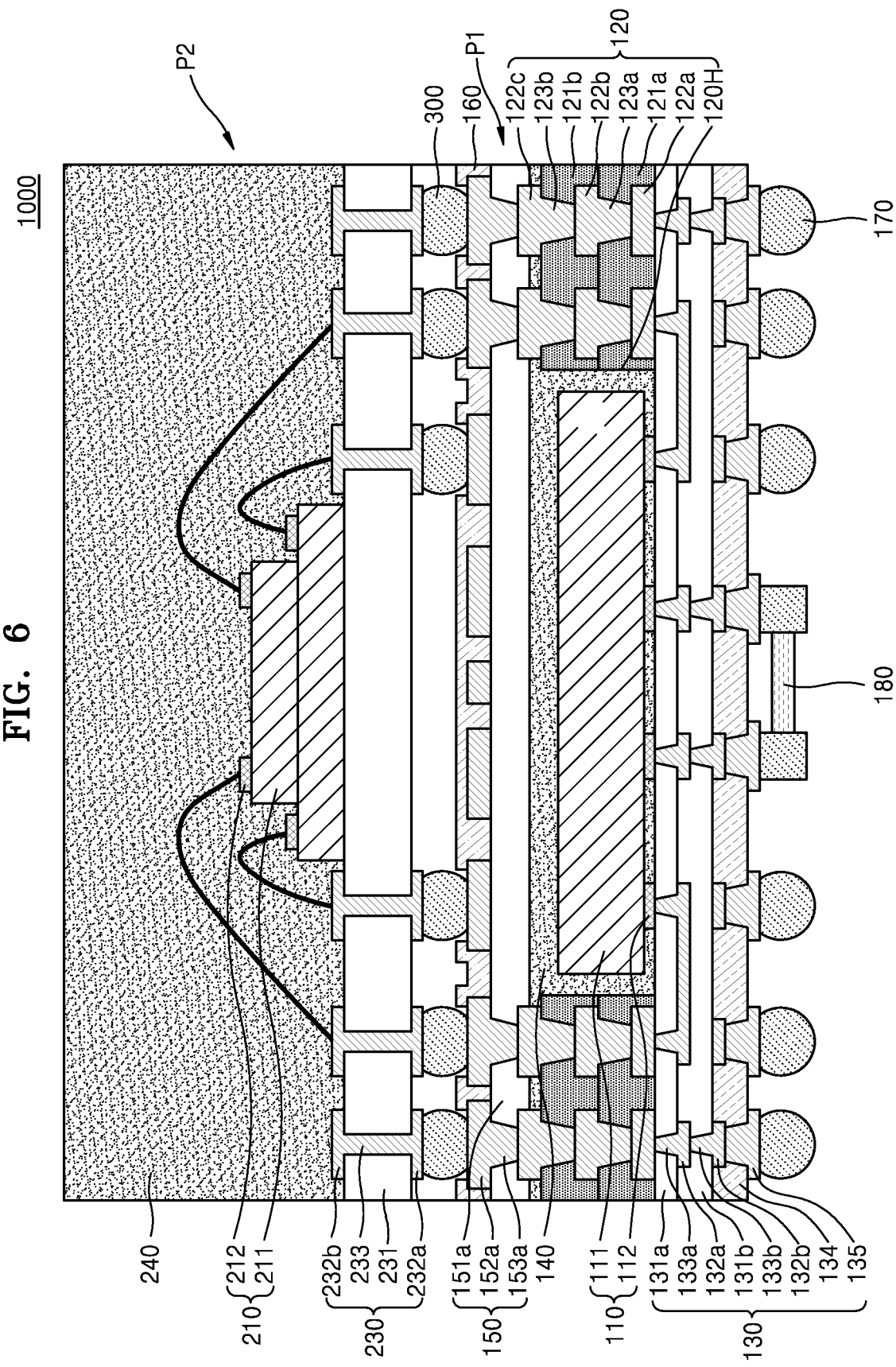

The first upper conductive pattern layer 152a and the first upper via 153a may include a conductive material (e.g., Cu, Au, Ag, Ni, W, Al, or a combination thereof). According to some embodiments of the inventive concept, the first upper conductive pattern layer 152a and the first upper via 153a may further include a barrier material (e.g., Ti, Ta, TiN, TaN, or a combination thereof) to prevent the conductive material from diffusing outward. According to some embodiments of the inventive concept, the first upper conductive pattern layer 152a may further include a wetting material to improve wettability between the conductive material and another connection member (e.g., an inter-package connection member 300, as illustrated in the example of FIG. 6). When the conductive material includes Cu, the wetting material may include Ni, Au, or a combination thereof.

A chemical composition of the first upper insulating layer 151a may differ from a chemical composition of the first sealing layer 140. For example, the first sealing layer 140 may include a material (e.g., a build-up film such as an ABF) that is easy to in-fill between the intermediate connection structure 120 and the first semiconductor chip 110. The first sealing layer 140 formed using the build-up film may include a composite material such as a matrix and a filler inside the matrix. To easily perform a process of etching the first sealing layer 140 in an operation of exposing the intermediate connection structure 120, a nanofiller having a one-directional dimension of 1 μm or less may be used as the filler. Moreover, the first upper insulating layer 151a may include a material (e.g., a photosensitive insulating material (a photo-imageable dielectric (PID)), that will easily form a fine pattern. The first upper insulating layer 151a including the photosensitive insulating material may not include the filler. Because the first upper insulating layer 151a does not include the filler, contamination of manufacturing equipment (e.g., a sputtering chamber) by the filler may be prevented when the first upper conductive pattern layer 152a and the first upper via 153a are formed on the first upper insulating layer 151a by using (e.g.) sputtering.

The upper protective layer 160 may cover the first upper insulating layer 151a and expose at least a portion of the first upper conductive pattern layer 152a. The upper protective layer 160 may include (e.g.) a solder resist.

The external connection terminal 170 may be on a lower surface of the lower pad 135 of the lower connection structure 130. The external connection terminal 170 may include a conductive material (e.g., tin (Sn), lead (Pb), Ag, Cu, or a combination thereof). The external connection terminal 170 may include a solder ball. The external connection terminal 170 may connect the semiconductor package 100 to a circuit board, another semiconductor package, an interposer, or a combination thereof. The capacitor 180 may be used to stabilize power, and may be connected to the lower connection structure 130 through the lower pad 135 of the lower connection structure 130.

Figure 2:
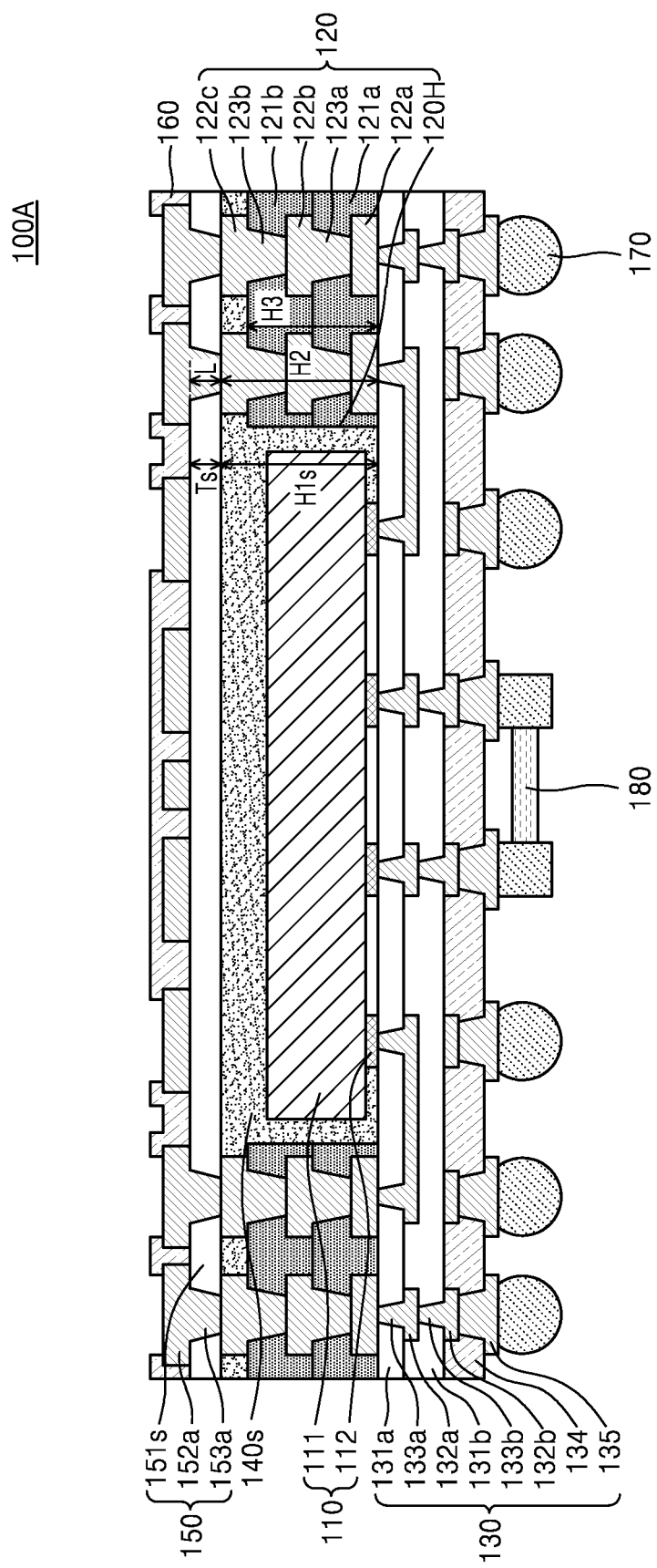

FIG. 2 is a cross-sectional view of a semiconductor package 100A according to embodiments of the inventive concept. Hereinafter, difference(s) between the semiconductor package 100 of FIG. 1 and the semiconductor package 100A of FIG. 2 will be described.

Referring to FIG. 2, a height H1s from the upper surface of the lower connection structure 130 to an upper surface of a first sealing layer 140s may be the same as the height H2 from the upper surface of the lower connection structure 130 to the upper surface of the intermediate connection structure 120 (e.g., the upper surface of the first intermediate conductive pattern layer 122c). That is, the upper surface of the intermediate connection structure 120 (e.g., the upper surface of the first intermediate conductive pattern layer 122c) may be coplanar with the upper surface of the first sealing layer 140s. In other words, the length 'L' from the lower end of the first upper via 153a to the upper end of the first upper via 153a may be the same as a maximum thickness 'Ts' of a first upper insulating layer 151s. According to some embodiments of the inventive concept, the thickness 'Ts' of the first upper insulating layer 151s may be substantially uniform.

Figure 3:
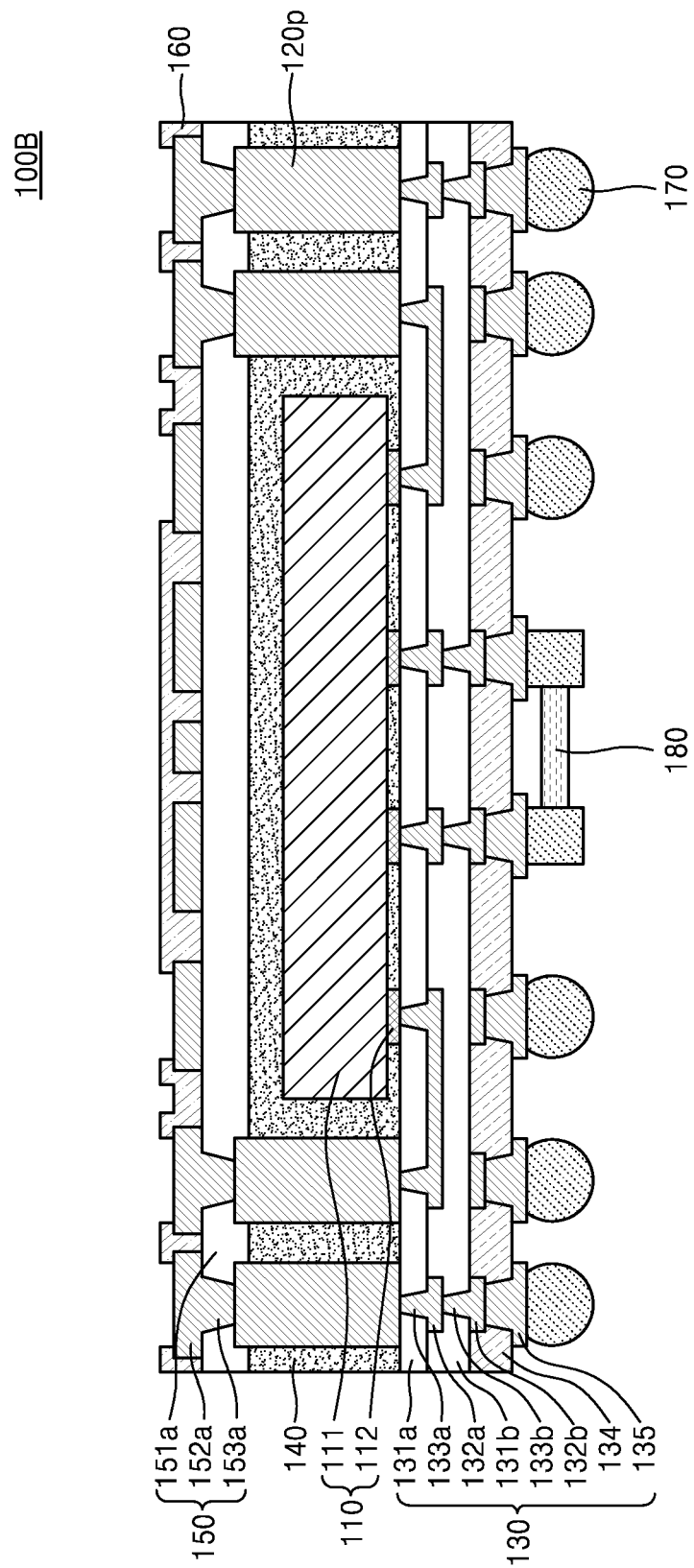

FIG. 3 is a cross-sectional view of a semiconductor package 100B according to embodiments of the inventive concept. Hereinafter, difference(s) between the semiconductor package 100 of FIG. 1 and the semiconductor package 100B of FIG. 3 will be described.

Referring to FIG. 3, an intermediate connection structure 120p may include a pillar penetrating a lower part of the first upper insulating layer 151a and the first sealing layer 140 and extending from the upper surface of the lower connection structure 130 to a lower surface of the first upper via 153a of the upper connection structure 150. The pillar may include a conductive material (e.g., Cu, Au, Ag, Ni, W, Al, or a combination thereof).

Figure 4:
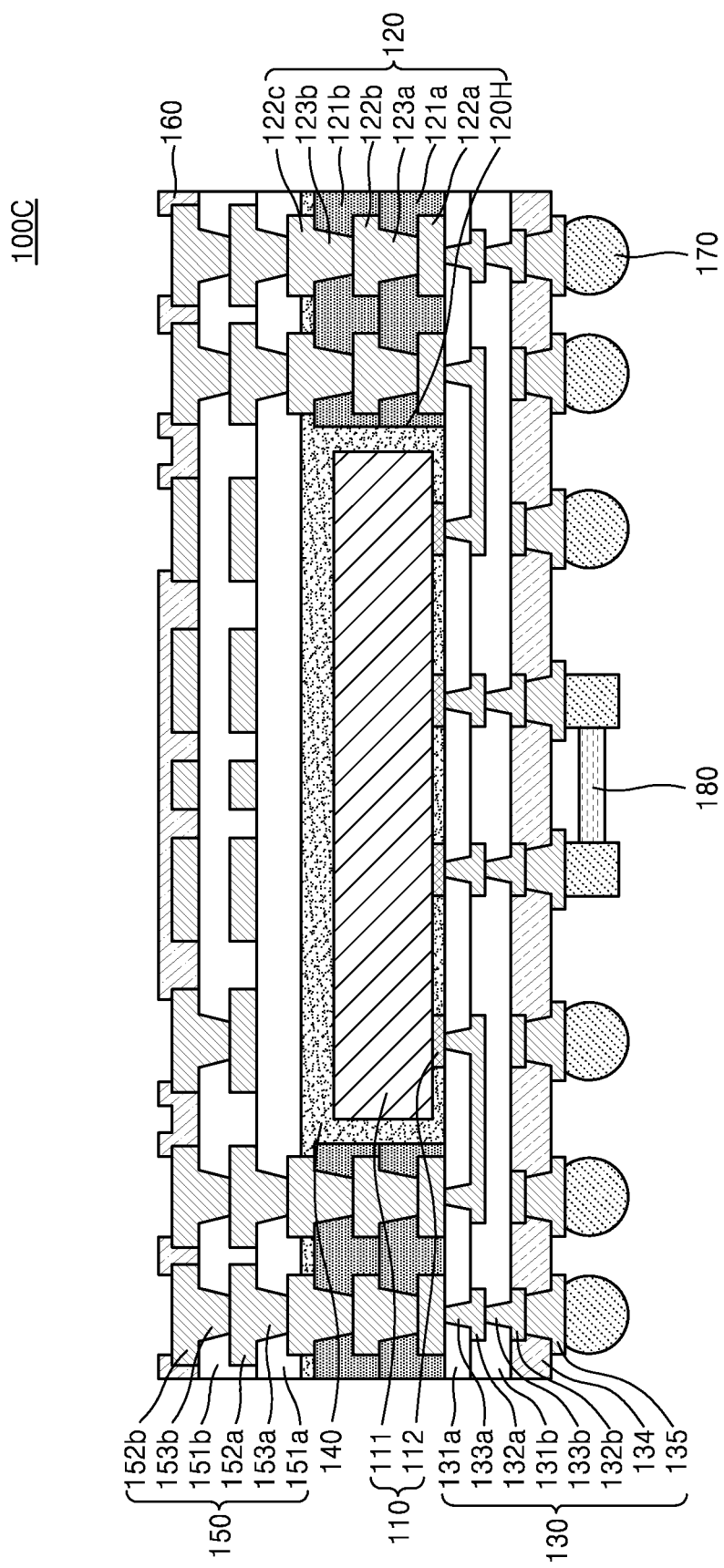

FIG. 4 is a cross-sectional view of a semiconductor package 100C according to embodiments of the inventive concept. Hereinafter, difference(s) between the semiconductor package 100 of FIG. 1 and the semiconductor package 100C of FIG. 4 will be described.

Referring to FIG. 4, the upper connection structure 150 may include a plurality of conductive pattern layers (e.g., the first conductive pattern layer 152a and a second upper conductive pattern layer 152b). For example, the upper connection structure 150 may further include a second upper insulating layer 151b on the upper surface of the first upper insulating layer 151a and an upper surface of the first upper conductive pattern layer 152a, the second upper conductive pattern layer 152b on an upper surface of the second upper insulating layer 151b, and a second upper via 153b penetrating the second upper insulating layer 151b and extending between the second upper conductive pattern layer 152b and the first upper conductive pattern layer 152a. The upper protective layer 160 may cover the second upper insulating layer 151b and expose at least a portion of the second upper conductive pattern layer 152b. According to some embodiments of the inventive concept, the upper connection structure 150 may further include additional upper insulating layers, upper conductive patterns, and upper vias.

According to some embodiments of the inventive concept, at least a portion of the first upper conductive pattern layer 152a is electrically grounded and at least a portion of the second upper conductive pattern layer 152b may be configured to transmit various signal(s). Furthermore, the first upper conductive pattern layer 152a may be mainly used for grounding, and the second upper conductive pattern layer 152b may be mainly used for signal transmission. By grounding at least a portion of the first upper conductive pattern layer 152a, characteristics (e.g., signal integrity) of signal(s) transmitted through the second upper conductive pattern layer 152b and power characteristics (e.g., power integrity) may be improved.

Figure 5:
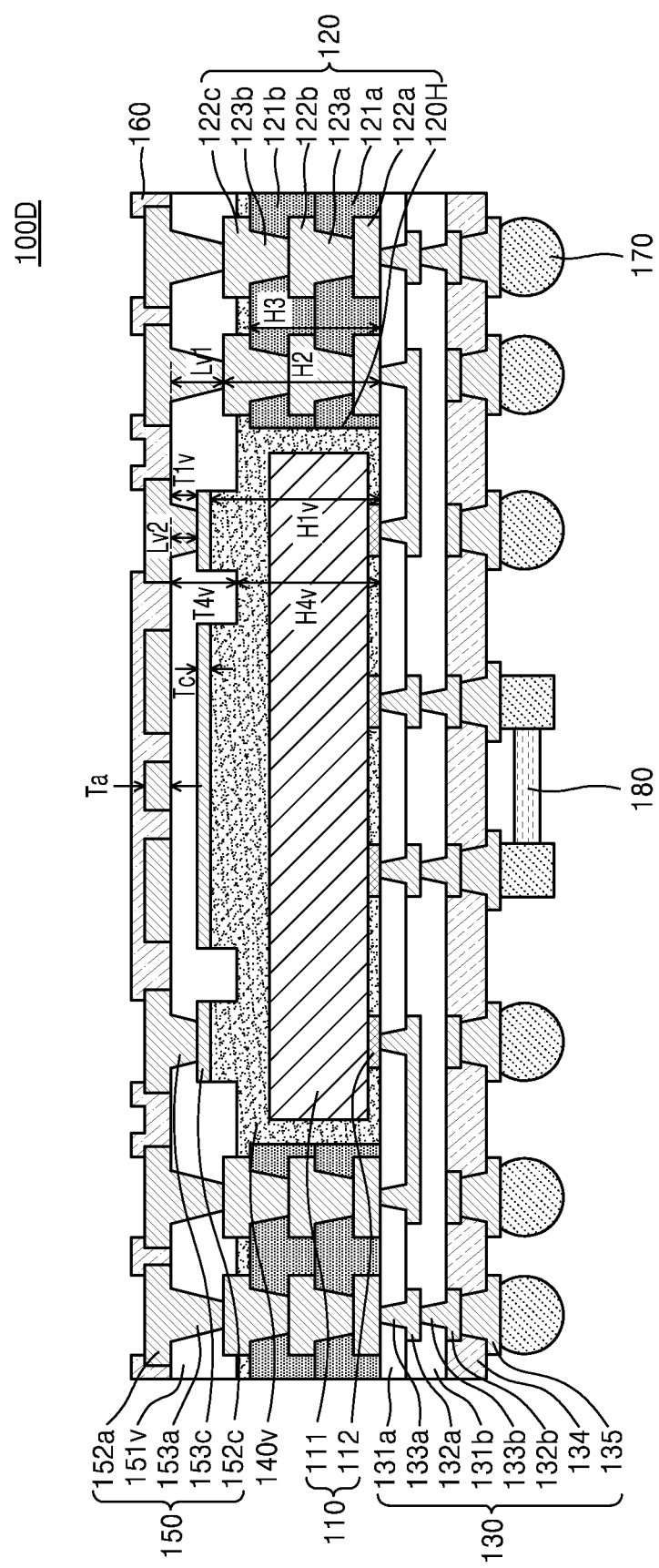

FIG. 5 is a cross-sectional view of a semiconductor package 100D according to embodiments of the inventive concept. Hereinafter, difference(s) between the semiconductor package 100 of FIG. 1 and the semiconductor package 100D of FIG. 5 will be described.

Referring to FIG. 5, the upper connection structure 150 may include a plurality of conductive pattern layers (e.g., the first conductive pattern layer 152a and a third upper conductive pattern layer 152c). For example, the upper connection structure 150 may further include the third upper conductive pattern layer 152c between a first sealing layer 140v and a first upper insulating layer 151v, and a third upper via 153c penetrating the first upper insulating layer 151v and extending between the first upper conductive pattern layer 152a and the third upper conductive pattern layer 152c. According to some embodiments of the inventive concept, the upper connection structure 150 may further include additional upper insulating layers, upper conductive patterns, and upper vias.

According to some embodiments of the inventive concept, at least a portion of the third upper conductive pattern layer 152c may be electrically grounded and at least a portion of the first upper conductive pattern layer 152a may be configured to transmit various signal(s). That is, the third upper conductive pattern layer 152c may be mainly used for grounding, and the first upper conductive pattern layer 152a may be mainly used for signal transmission. By grounding at least a portion of the third upper conductive pattern layer 152c, characteristics (e.g., signal integrity) of a signal transmitted through the first upper conductive pattern layer 152a and power characteristics (e.g., power integrity) may be improved.

According to some embodiments of the inventive concept, the upper connection structure 150 may not include a via directly connecting the third upper conductive pattern layer 152c to the intermediate connection structure 120. That is, the upper connection structure 150 may not include a via extending from the third upper conductive pattern layer 152c to the first intermediate conductive pattern layer 122c of the intermediate connection structure 120. According to some embodiments of the inventive concept, the third upper conductive pattern layer 152c may be indirectly connected to the intermediate connection structure 120 through the third upper via 153c, the first upper conductive pattern layer 152a, and the first upper via 153a. Because the upper connection structure 150 does not include a via on a lower surface of the third upper conductive pattern layer 152c,h the third upper conductive pattern layer 152c does not have to be thick to fill in a via on the lower surface of third upper conductive pattern layer 152c to simultaneously produce the third upper conductive pattern layer 152c and the via. Therefore, a thickness of the third upper conductive pattern layer 152c may be relatively less than, for example, a thickness of the first upper conductive pattern layer 152a simultaneously formed together with the first upper via 153a and the third upper via 153c. That is, a thickness 'Tc' of the third upper conductive pattern layer 152c may be less than a thickness 'Ta' of the first upper conductive pattern layer 152a. Accordingly, the overall thickness of the semiconductor package 100D may be reduced.

According to some embodiments of the inventive concept, an upper surface of the first sealing layer 140v may not be flat. For example, a height H1v from the upper surface of the lower connection structure 130 to a part of the upper surface of the first sealing layer 140v, which is covered by the third upper conductive pattern layer 152c, may be greater than a height H4v from the upper surface of the lower connection structure 130 to a part of the upper surface of the first sealing layer 140v, which is not covered by the third upper conductive pattern layer 152c. The height H1v from the upper surface of the lower connection structure 130 to the part of the upper surface of the first sealing layer 140v, which is covered by the third upper conductive pattern layer 152c, may correspond to a maximum height from the upper surface of the lower connection structure 130 to the upper surface of the first sealing layer 140v, and the height H4v from the upper surface of the lower connection structure 130 to the part of the upper surface of the first sealing layer 140v, which is not covered by the third upper conductive pattern layer 152c, may correspond to a minimum height from the upper surface of the lower connection structure 130 to the upper surface of the first sealing layer 140v. According to some embodiments of the inventive concept, the height H1v from the upper surface of the lower connection structure 130 to the part of the upper surface of the first sealing layer 140v, which is covered by the third upper conductive pattern layer 152c, may be greater than the height H2 from the upper surface of the lower connection structure 130 to the upper surface of the intermediate connection structure 120 (e.g., the upper surface of the first intermediate conductive pattern layer 122c). However, the height H4v from the upper surface of the lower connection structure 130 to the part of the upper surface of the first sealing layer 140v, which is not covered by the third upper conductive pattern layer 152c, may be less than the height H2 from the upper surface of the lower connection structure 130 to the upper surface of the intermediate connection structure 120 (e.g., the upper surface of the first intermediate conductive pattern layer 122c).

According to some embodiments of the inventive concept, a thickness of the first upper insulating layer 151v may not be uniform. For example, a thickness T1v of a part of the first upper insulating layer 151v on the third upper conductive pattern layer 152c may be less than a thickness T4v of the remaining part of the first upper insulating layer 151v. The thickness T1v of the part of the first upper insulating layer 151v on the third upper conductive pattern layer 152c may correspond to a minimum thickness of the first upper insulating layer 151v, and the thickness T4v of the remaining part of the first upper insulating layer 151v may correspond to a maximum thickness of the first upper insulating layer 151v. According to some embodiments of the inventive concept, the thickness T1v of the part of the first upper insulating layer 151v on the third upper conductive pattern layer 152c may be less than a length Lv1 from the lower end of the first upper via 153a to the upper end of the first upper via 153a and the same as a length Lv2 from a lower end of the third upper via 153c to an upper end of the third upper via 153c. According to some embodiments of the inventive concept, the thickness T4v of the remaining part of the first upper insulating layer 151v may be greater than the length Lv2 from the lower end of the third upper via 153c to the upper end of the third upper via 153c and greater than or equal to the length Lv1 from the lower end of the first upper via 153a to the upper end of the first upper via 153a. Still, the length Lv1 from the lower end of the first upper via 153a to the upper end of the first upper via 153a may be less than or equal to the maximum thickness T4v of the first upper insulating layer 151v. In addition, still, the upper surface of the intermediate connection structure 120, e.g., the upper surface of the first intermediate conductive pattern layer 122c, may protrude upward from the upper surface of the first sealing layer 140v.

FIG. 6 is a cross-sectional view of a semiconductor package 1000 according to embodiments of the inventive concept.

Referring to FIG. 6, the semiconductor package 1000 may include a lower semiconductor package P1, an upper semiconductor package P2 on the lower semiconductor package P1, and an inter-package connection member 300 between the lower semiconductor package P1 and the upper semiconductor package P2. That is, the semiconductor package 1000 may be a package on package (POP) type. The lower semiconductor package P1 may be one of the semiconductor package 100 of FIG. 1, the semiconductor package 100A of FIG. 2, the semiconductor package 100B of FIG. 3, the semiconductor package 100C of FIG. 4, and the semiconductor package 100D of FIG. 5.

The upper semiconductor package P2 may include a connection structure 230, a second semiconductor chip 210 on the connection structure 230, and a second sealing layer 240 covering the connection structure 230 and the second semiconductor chip 210. According to some embodiments of the inventive concept, the upper semiconductor package P2 may include a plurality of second semiconductor chips 210 stacked on the connection structure 230.

The connection structure 230 may include, for example, an insulating layer 231, an upper conductive pattern layer 232b on an upper surface of the insulating layer 231, a lower conductive pattern layer 232a on a lower surface of the insulating layer 231, and a via 233 connecting the upper conductive pattern layer 232b to the lower conductive pattern layer 232a by penetrating the insulating layer 231 and extending between the upper conductive pattern layer 232b and the lower conductive pattern layer 232a. The connection structure 230 may include a PCB or a redistribution structure. The insulating layer 231 may include flame retardant 4 (FR4), tetrafunctional epoxy, polyphenylene ether, epoxy/polyphenylene oxide, bismaleimide triazine (BT), Thermount, cyanate ester, polyimide, or a combination thereof. The upper conductive pattern layer 232b, the lower conductive pattern layer 232a, and the via 233 may include a conductive material (e.g., Cu, Au, Ag, Ni, W, Al, or a combination thereof).

The second semiconductor chip 210 may include a body 211 and a chip pad 212 on an upper surface of the body 211. The body 211 may include a substrate and an integrated circuit, and the integrated circuit may be on an upper surface of the second semiconductor chip 210. That is, an active surface of the second semiconductor chip 210 may be the upper surface of the second semiconductor chip 210. The second semiconductor chip 210 may be connected to the upper conductive pattern layer 232b of the connection structure 230 through a wire. According to some embodiments of the inventive concept, the chip pad 212 of the second semiconductor chip 210 may be on a lower surface of the second semiconductor chip 210, and the integrated circuit of the body 211 of the second semiconductor chip 210 may be on the lower surface of the second semiconductor chip 210. That is, an active surface of the second semiconductor chip 210 may be the lower surface of the second semiconductor chip 210. In this case, the second semiconductor chip 210 may be connected to the upper conductive pattern layer 232b of the connection structure 230 through a bump or pillar.

According to some embodiments of the inventive concept, the integrated circuit of the body 111 of the first semiconductor chip 110 of the lower semiconductor package P1 may include a logic circuit, and the integrated circuit of the body 211 of the second semiconductor chip 210 of the upper semiconductor package P2 may include a memory circuit. The second sealing layer 240 may include a thermosetting resin such as an epoxy resin or a thermoplastic resin such as polyimide. Alternatively, the second sealing layer 240 may include a molding material such as an EMC or a photosensitive material such as a PIE.

The inter-package connection member 300 may be between the lower conductive pattern layer 232a of the connection structure 230 of the upper semiconductor package P2 and the first upper conductive pattern layer 152a of the upper connection structure 150 of the lower semiconductor package P1 and connect the lower conductive pattern layer 232a of the connection structure 230 of the upper semiconductor package P2 to the first upper conductive pattern layer 152a of the upper connection structure 150 of the lower semiconductor package P1. The upper protective layer 160 of the lower semiconductor package P1 may expose a part of the first upper conductive pattern layer 152a in contact with the inter-package connection member 300 and cover the remaining part of the first upper conductive pattern layer 152a. The inter-package connection member 300 may include a conductive material including (e.g., Sn, Pb, Ag, Cu, or a combination thereof). The inter-package connection member 300 may include a solder ball.

FIGS. 7A, 7B, 7C, 7D, 7E and 7F (inclusively, "FIGS. 7A to 7F") are related, cross-sectional views that further illustrate a method of manufacturing a semiconductor package according to embodiments of the inventive concept.

Figure 7A:
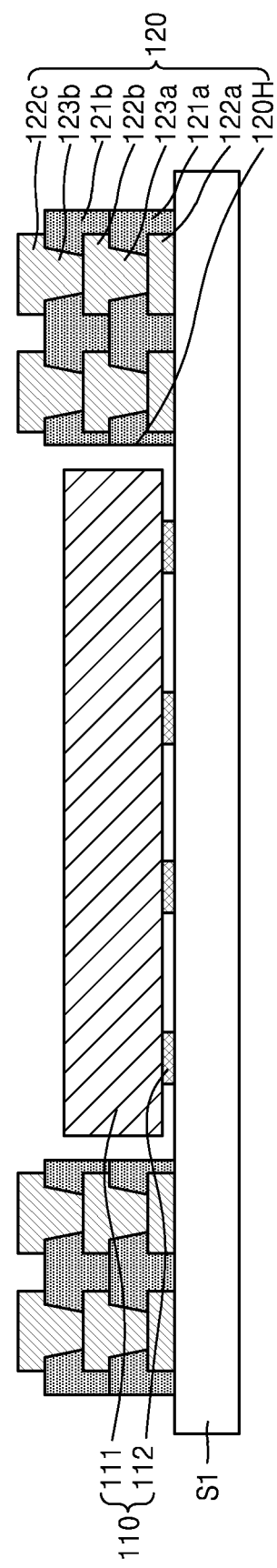
FIGS. 7A to 7F are related, cross-sectional views further illustrating a method of manufacturing a semiconductor package according to embodiments of the inventive concept.

Referring to FIG. 7A, the hole 120H penetrating the intermediate connection structure 120 is formed in the intermediate connection structure 120. The hole 120H of the intermediate connection structure 120 may be formed by, for example, mechanical drilling, laser drilling, sand blast, dry etching, and/or wet etching. Next, a first support structure 51 may be attached to the lower surface of the intermediate connection structure 120. The first support structure 51 may include any material (e.g., an adhesive film) which may fix the first support structure 51. The adhesive film may be a thermosetting adhesive film, of which an adhesive force is weakened by heat treatment, or an ultraviolet-curing adhesive film, of which an adhesive force is weakened by ultraviolet irradiation. Next, the first semiconductor chip 110 is disposed in the hole 120H of the intermediate connection structure 120 so that the chip pad 112 of the first semiconductor chip 110 faces the first support structure 51, and the first semiconductor chip 110 may be attached to the first support structure 51.

Figure 7B:
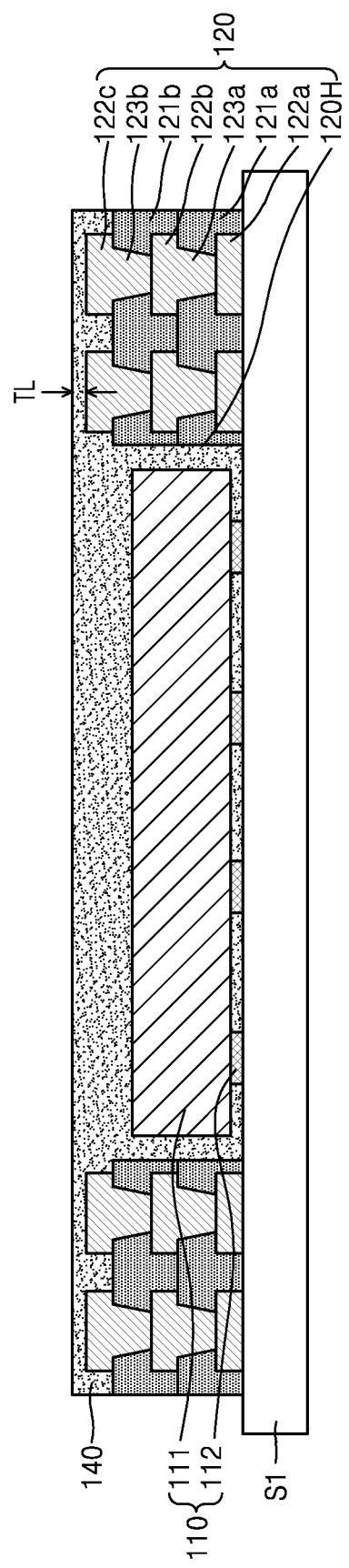

Referring to FIG. 7B, the first sealing layer 140 covering the first semiconductor chip 110 and the intermediate connection structure 120 may be formed. Those skilled in the art will appreciate that the first sealing layer 140 may be formed using known method(s). For example, the first sealing layer 140 may be formed by laminating a sealing material (e.g., a build-up film) on the upper surface of the first semiconductor chip 110 and the upper surface of the intermediate connection structure 120. Alternatively, the first sealing layer 140 may be formed by coating a liquid sealing material on the first support structure 51, the first semiconductor chip 110, and the intermediate connection structure 120 and then curing the sealing material. To easily perform later an operation of etching an upper part of the first sealing layer 140 to expose the upper surface of the intermediate connection structure 120 (e.g., the upper surface of the first intermediate conductive pattern layer 122c) a thickness 'TL' of the first sealing layer 140 on the upper surface of the intermediate connection structure 120 (e.g., the upper surface of the first intermediate conductive pattern layer 122c) is preferably, about 5 μm or less. In order to form the desired thickness 'TL' of the first sealing layer 140 on the upper surface of the first intermediate conductive pattern layer 122c, the size of a filler in the first sealing layer 140 is preferably small (e.g., a nanofiller).

Figure 7C:
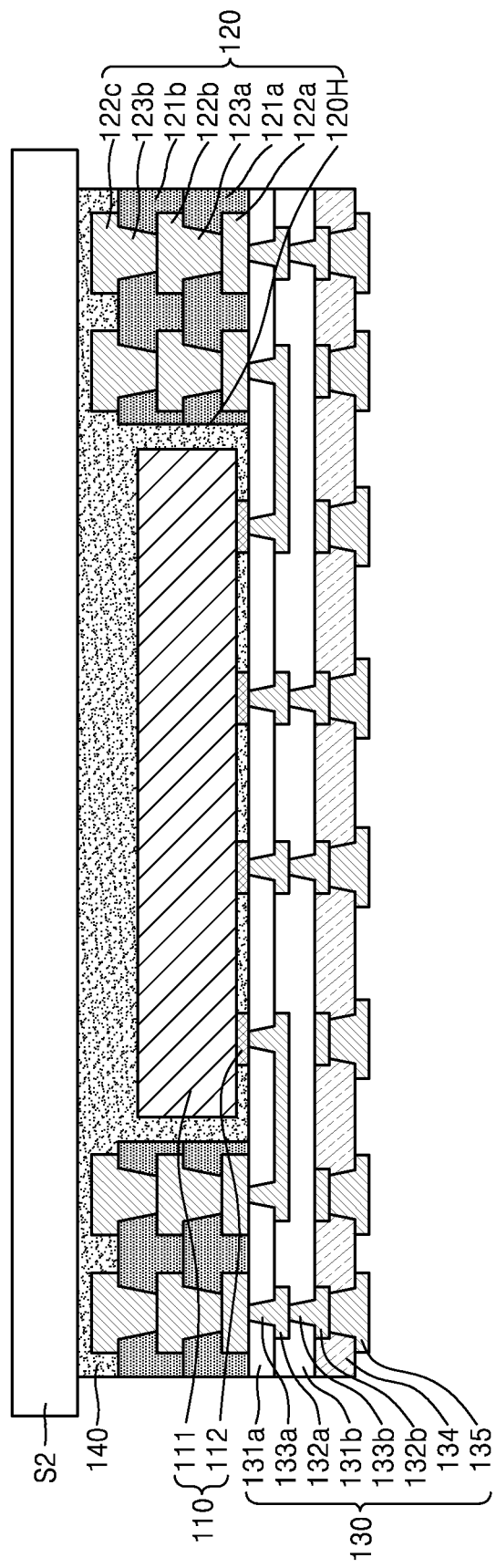

Referring to FIGS. 7B and 7C, the first support structure 51 may be removed from the first semiconductor chip 110 and the intermediate connection structure 120. For example, the first support structure 51 may be removed after weakening the adhesive force of the first support structure 51 by using heat and/or ultraviolet light.

Referring to FIGS. 7B and 7C, a second support structure S2 may be attached onto the first sealing layer 140. Next, the lower connection structure 130 may be formed on the lower surface of the intermediate connection structure 120 and the lower surface of the first semiconductor chip 110. For example, the first lower insulating layer 131a may be formed on the lower surface of the intermediate connection structure 120 and the lower surface of the first semiconductor chip 110, the first lower via 133a and the first lower conductive pattern layer 132a may be formed on the first lower insulating layer 131a, the second lower insulating layer 131b may be formed on the first lower insulating layer 131a and the first lower conductive pattern layer 132a, the second lower via 133b and the second lower conductive pattern layer 132b may be formed on the second lower insulating layer 131b, the lower protective layer 134 may be formed on the second lower conductive pattern layer 132b and the second lower insulating layer 131b, and the lower pad 135 may be formed on the lower protective layer 134.

Alternately in other embodiments of the inventive concept, the lower connection structure 130 may be first formed on a support structure (not shown), then the intermediate connection structure 120 and the first semiconductor chip 110 may be attached onto the lower connection structure 130, and then the first sealing layer 140 may be formed.

Figure 7D:
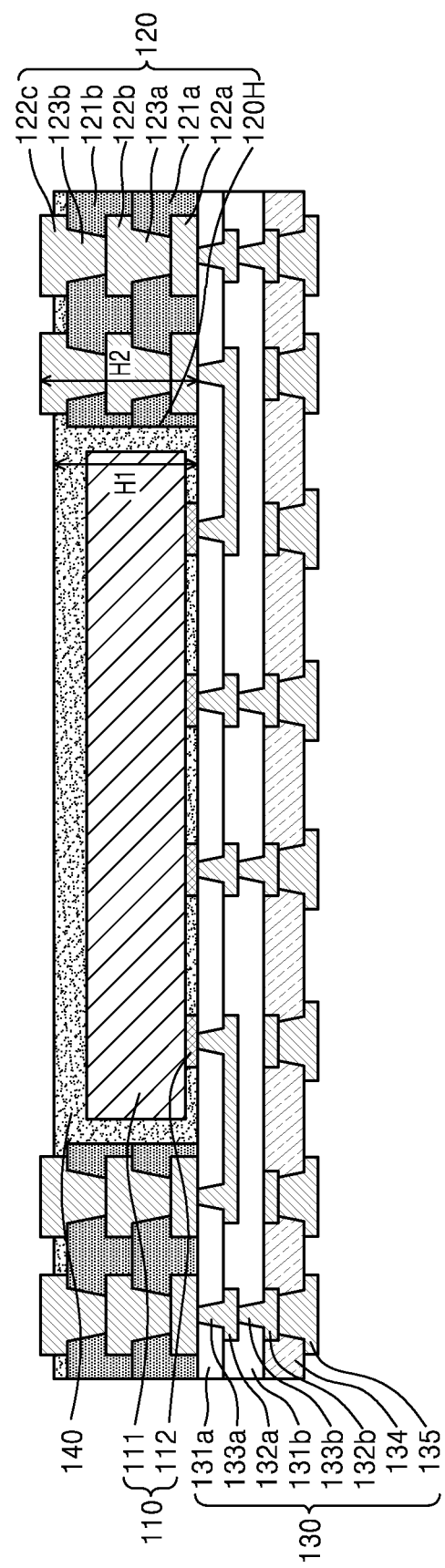

Referring to FIGS. 7C and 7D, the second support structure S2 may be removed from the first sealing layer 140. Next, an upper part of the first sealing layer 140 may be etched to expose the upper surface of the intermediate connection structure 120, e.g., the upper surface of the first intermediate conductive pattern layer 122c. For example, the first sealing layer 140 may be wet-etched. For example, a known desmear process may be performed to remove residual substances generated when an opening is formed after forming the opening in the first sealing layer 140 by using, for example, laser drilling may be used. The desmear process may include etching the first sealing layer 140 by using (e.g.) a permanganic acid. To ensure the exposure of the intermediate connection structure 120, the first sealing layer 140 may be over-etched. Therefore, the height H1 from the upper surface of the lower connection structure 130 to the upper surface of the first sealing layer 140 may be less than the height H2 from the upper surface of the lower connection structure 130 to the upper surface of the intermediate connection structure 120 (e.g., the upper surface of the first intermediate conductive pattern layer 122c). In addition, the upper surface of the intermediate connection structure 120 may extend or protrude upward from the upper surface of the first sealing layer 140. In order to easily etch the first sealing layer 140, the size of a filler in the first sealing layer 140 is preferably small (e.g., a nanofiller).

Figure 7E:
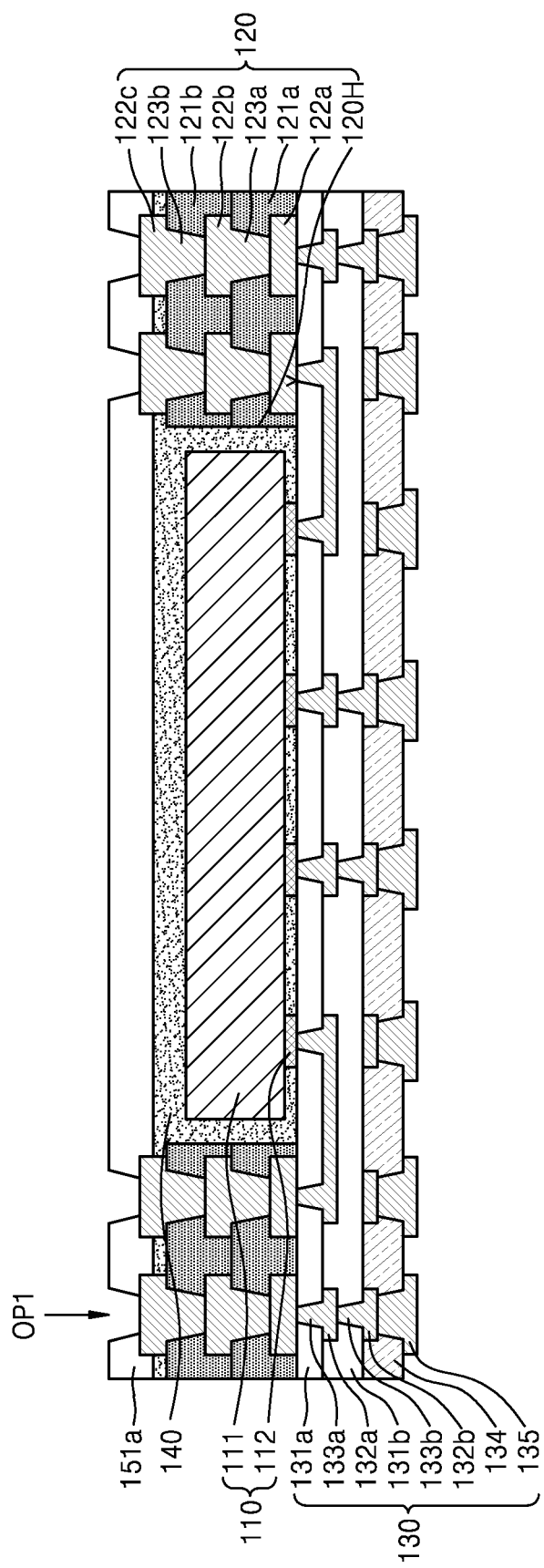

Referring to FIG. 7E, the first upper insulating layer 151a having a first opening OP1, through which at least some of the upper surface of the intermediate connection structure 120 (e.g., the upper surface of the first intermediate conductive pattern layer 122c) is exposed may be formed on the first sealing layer 140 and the intermediate connection structure 120. For example, the first opening OP1, through which the first intermediate conductive pattern layer 122c of the intermediate connection structure 120 is exposed, may be formed by coating a liquid photosensitive insulating material on the first sealing layer 140 and the intermediate connection structure 120 and selectively exposing to light and developing the photosensitive insulating material. The first opening OP1 of a small size may be easily formed in the first upper insulating layer 151a by using the photosensitive insulating material.

Figure 7F:
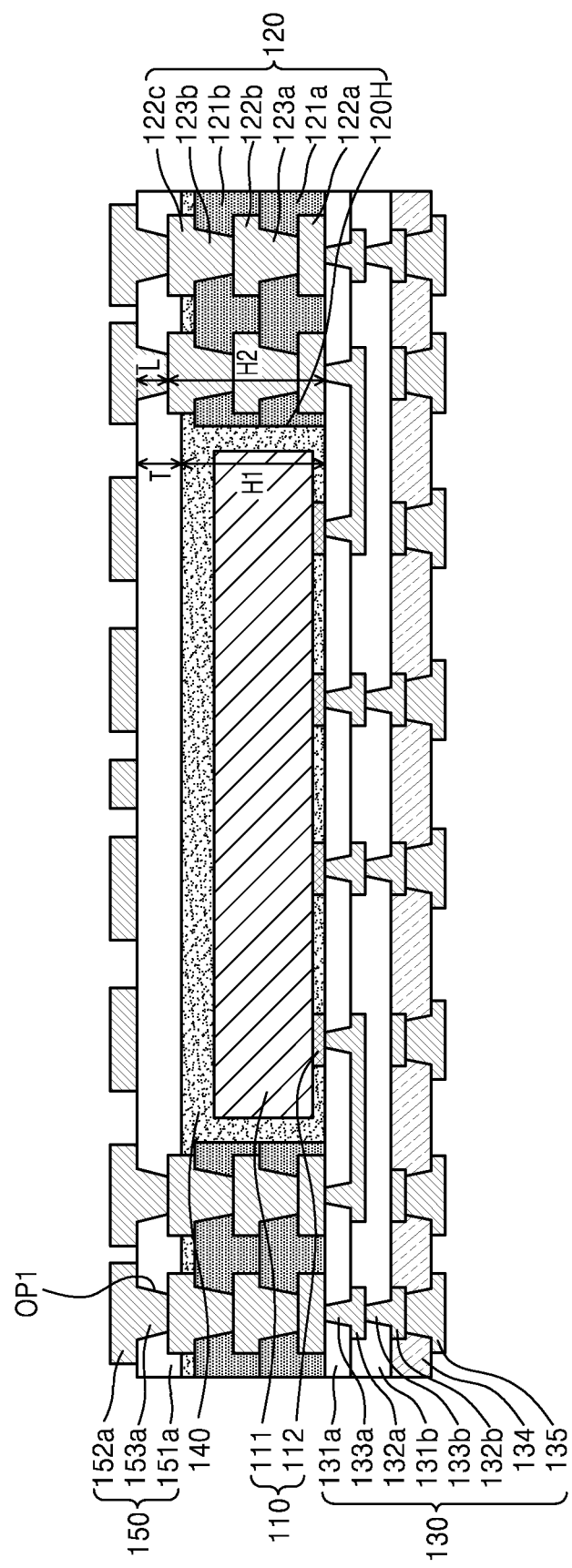

Referring to FIG. 7F, the first upper via 153a filling in the first opening OP1 of the first upper insulating layer 151a and the first upper conductive pattern layer 152a on the first upper insulating layer 151a may be formed. For example, the first upper via 153a and the first upper conductive pattern layer 152a may be formed by (e.g.) forming a mask pattern on the first upper insulating layer 151a, forming a seed layer on the first upper insulating layer 151a by using sputtering, forming a filling layer on the seed layer by using plating, and removing the mask pattern. According to some embodiments of the inventive concept, the forming of the first upper via 153a and the first upper conductive pattern layer 152a may further include forming a wetting layer on the filling layer by using, for example, plating. When the first upper insulating layer 151a does not include a filler, manufacturing equipment (e.g., a sputter chamber) may not be contaminated by the filler when the first upper via 153a and the first upper conductive pattern layer 152a are formed (e.g.) during sputtering. Accordingly, the upper connection structure 150 may be completed. Because the height H1 from the upper surface of the lower connection structure 130 to the upper surface of the first sealing layer 140 is less than the height H2 from the upper surface of the lower connection structure 130 to the upper surface of the intermediate connection structure 120, the length 'L' from the lower end of the first upper via 153a to the upper end of the first upper via 153a may be less than the thickness 'T' of the first upper insulating layer 151a.

Next, referring back to FIG. 1, the upper protective layer 160 covering the first upper insulating layer 151a and exposing only a portion of the first upper conductive pattern layer 152a may be formed. In addition, the external connection terminal 170 and the capacitor 180 may be attached onto the lower pad 135. For example, the external connection terminal 170 attached onto the lower pad 135 of the lower connection structure 130 may be formed by reflowing a solder ball. Accordingly, the semiconductor package 100 of FIG. 1 may be completed.

According to a manufacturing method according to an embodiment of the inventive concept, an upper part of the first sealing layer 140 may be etched to expose the upper surface of the intermediate connection structure 120. Therefore, the overall thickness of the semiconductor package 100 of FIG. 1 may be reduced. In addition, because forming an opening in the first sealing layer 140 to expose the intermediate connection structure 120 may be omitted, a manufacturing cost may be reduced. In addition, because forming an opening in the first sealing layer 140 to expose the intermediate connection structure 120 may be omitted, the first opening OP1 in the first upper insulating layer 151a does not have to be formed smaller than the opening in the first sealing layer 140 by considering an alignment error between the opening in the first sealing layer 140 and the first opening OP1 in the first upper insulating layer 151a. This may prevent the formation of a low pattern density of the first opening OP1 formed in the first upper insulating layer 151a because of the opening in the first sealing layer 140 supposed to be formed larger than the first opening OP1 in the first upper insulating layer 151a. Accordingly, a degree of integration of the upper connection structure 150 may be improved.

During the etching of the first sealing layer 140, which has been described with reference to FIGS. 7C and 7D, when the etching of the first sealing layer 140 is terminated as soon as the first intermediate conductive pattern layer 122c of the intermediate connection structure 120 is exposed without over-etching the first sealing layer 140, the height H1 from the upper surface of the lower connection structure 130 to the upper surface of the first sealing layer 140 may be the same as the height H2 from the upper surface of the lower connection structure 130 to the first intermediate conductive pattern layer 122c. In this case, the semiconductor package 100A of FIG. 2 may be completed.

As described above with reference to FIG. 7F, the semiconductor package 100C of FIG. 4 may be completed by further performing operations of forming the second upper insulating layer 151b on the first upper conductive pattern layer 152a and the first upper insulating layer 151a, forming an opening (not shown) in the second upper insulating layer 151b, and forming the second upper via 153b in the opening of the second upper insulating layer 151b and the second upper conductive pattern layer 152b on the second upper insulating layer 151b after forming the first upper conductive pattern layer 152a.

FIGS. 8A, 8B, 8C, 8D and 8E (inclusively, FIGS. 8A to 8E) are related, cross-sectional views that further illustrate a method of manufacturing a semiconductor package according to embodiments of the inventive concept.

Figure 8A:
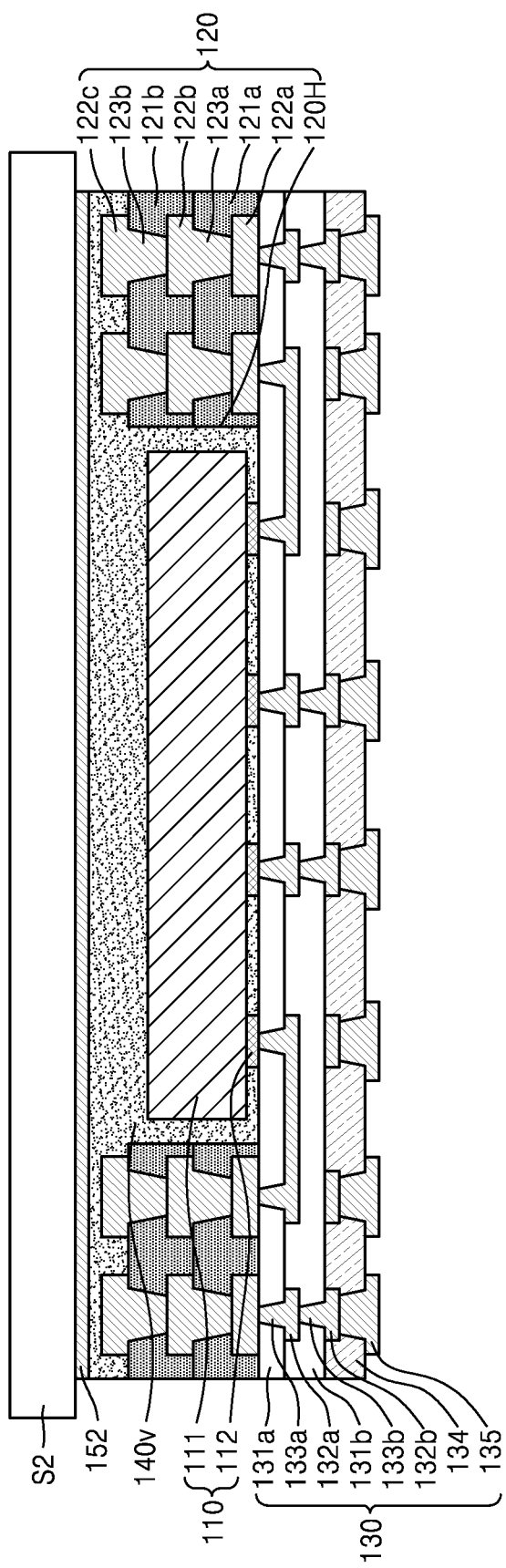
FIGS. 8A to 8E are related, cross-sectional views further illustrating a method of manufacturing a semiconductor package according to embodiments of the inventive concept.

Referring to FIG. 8A, as described above with reference to FIGS. 7A and 7B, the first sealing layer 140v may be formed on the first semiconductor chip 110 and the intermediate connection structure 120. Next, an upper conductive layer 152 formed on the second support structure S2 may be attached onto the first sealing layer 140v so that the upper conductive layer 152 is in contact with the first sealing layer 140v. Next, the lower connection structure 130 may be formed on the lower surface of the intermediate connection structure 120 and the lower surface of the first semiconductor chip 110.

Figure 8B:
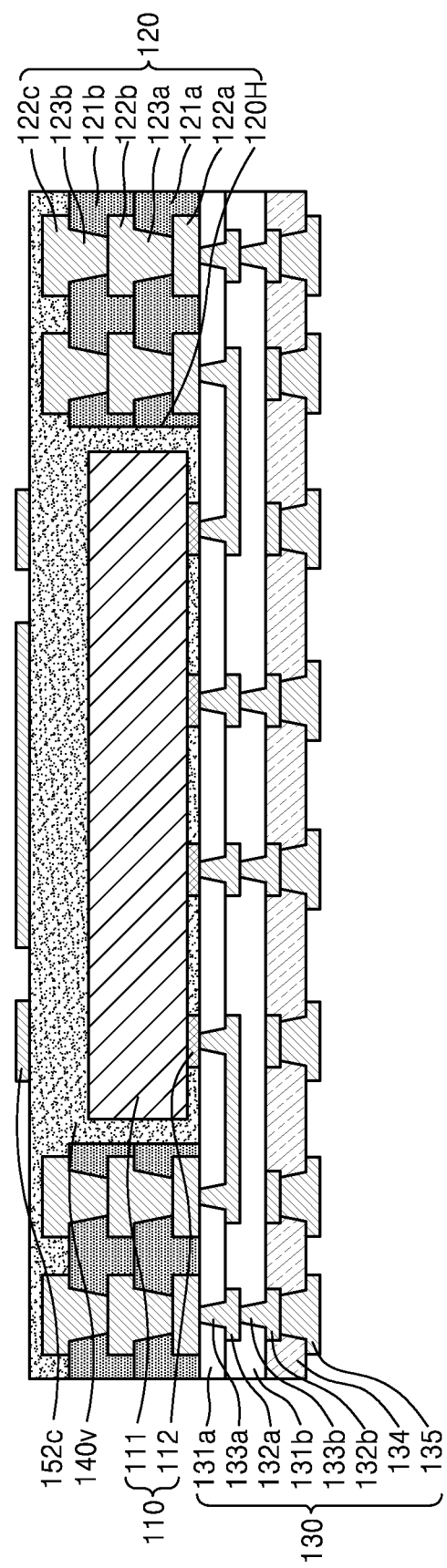

Referring to FIGS. 8A and 8B, the second support structure S2 may be removed while leaving the upper conductive layer 152 on the first sealing layer 140v. Next, the upper conductive layer 152 may be patterned through etching to form the third upper conductive pattern layer 152c. Because a via penetrating the first sealing layer 140v to be in contact with the lower surface of the third upper conductive pattern layer 152c does not have to be formed simultaneously together with the third upper conductive pattern layer 152c, it is not necessary to form the third upper conductive pattern layer 152c to be thick in order to fill in the via in contact with the lower surface of the third upper conductive pattern layer 152c. Therefore, the third upper conductive pattern layer 152c may be formed to be thin, and the semiconductor package 100D of FIG. 5 may be formed to be thin. Alternately, according to other embodiments of the inventive concept, the upper conductive layer 152 may not be formed on the second support structure S2, a mask pattern (not shown) may be formed on the first sealing layer 140v, and the third upper conductive pattern layer 152c may be formed by using the mask pattern.

Figure 8C:
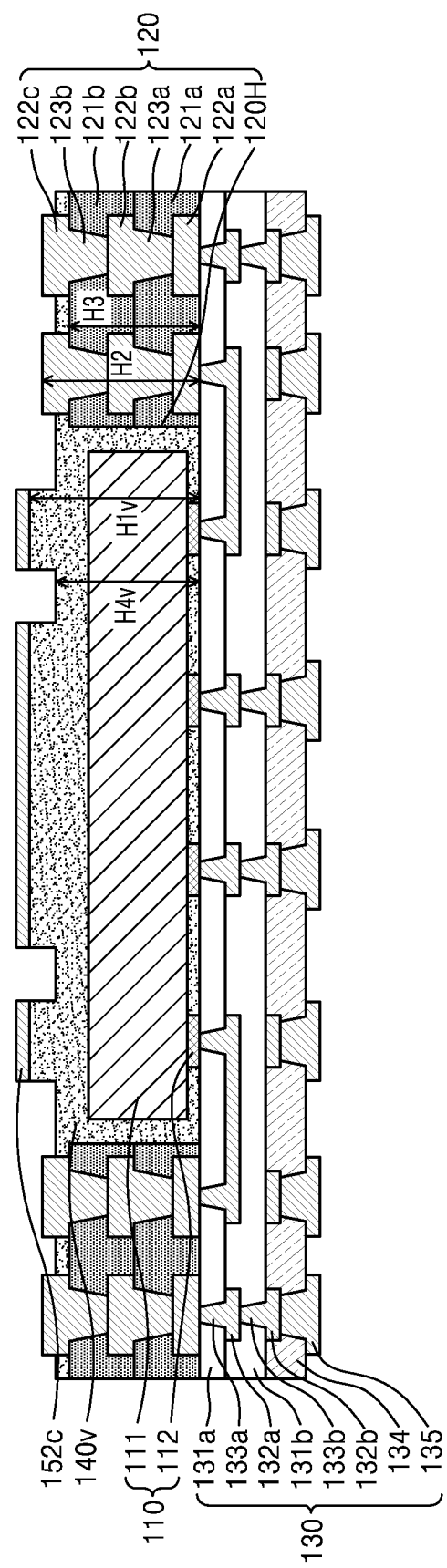

Referring to FIGS. 8B and 8C, an upper part of the first sealing layer 140v may be etched to expose the upper surface of the intermediate connection structure 120, e.g., the upper surface of the first intermediate conductive pattern layer 122c. For example, the first sealing layer 140v may be wet-etched For example, a conventional desmear process performed to remove residual substances generated when an opening is formed after forming the opening in the first sealing layer 140v by using, for example, laser drilling may be used. The desmear process may include (e.g.) a permanganic acid. Because the third upper conductive pattern layer 152c may function as an etching mask, a part of the first sealing layer 140v covered by the third upper conductive pattern layer 152c may not be etched. Therefore, the height H4v from the upper surface of the lower connection structure 130 to a part of the upper surface of the first sealing layer 140v, which is not covered by the third upper conductive pattern layer 152c, may be less than the height H1v from the upper surface of the lower connection structure 130 to the part of the upper surface of the first sealing layer 140v, which is covered by the third upper conductive pattern layer 152c.

The height H1v from the upper surface of the lower connection structure 130 to the part of the upper surface of the first sealing layer 140v, which is covered by the third upper conductive pattern layer 152c, may be greater than the height H2 from the upper surface of the lower connection structure 130 to the upper surface of the first intermediate conductive pattern layer 122c (e.g., the upper surface of the first intermediate conductive pattern layer 122c). However, to expose the upper surface of the first intermediate conductive pattern layer 122c (e.g., the upper surface of the first intermediate conductive pattern layer 122c), the height H4v from the upper surface of the lower connection structure 130 to the part of the upper surface of the first sealing layer 140v, which is not covered by the third upper conductive pattern layer 152c, may be less than or equal to the height H2 from the upper surface of the lower connection structure 130 to the upper surface of the first intermediate conductive pattern layer 122c (e.g., the upper surface of the first intermediate conductive pattern layer 122c).

Figure 8D:
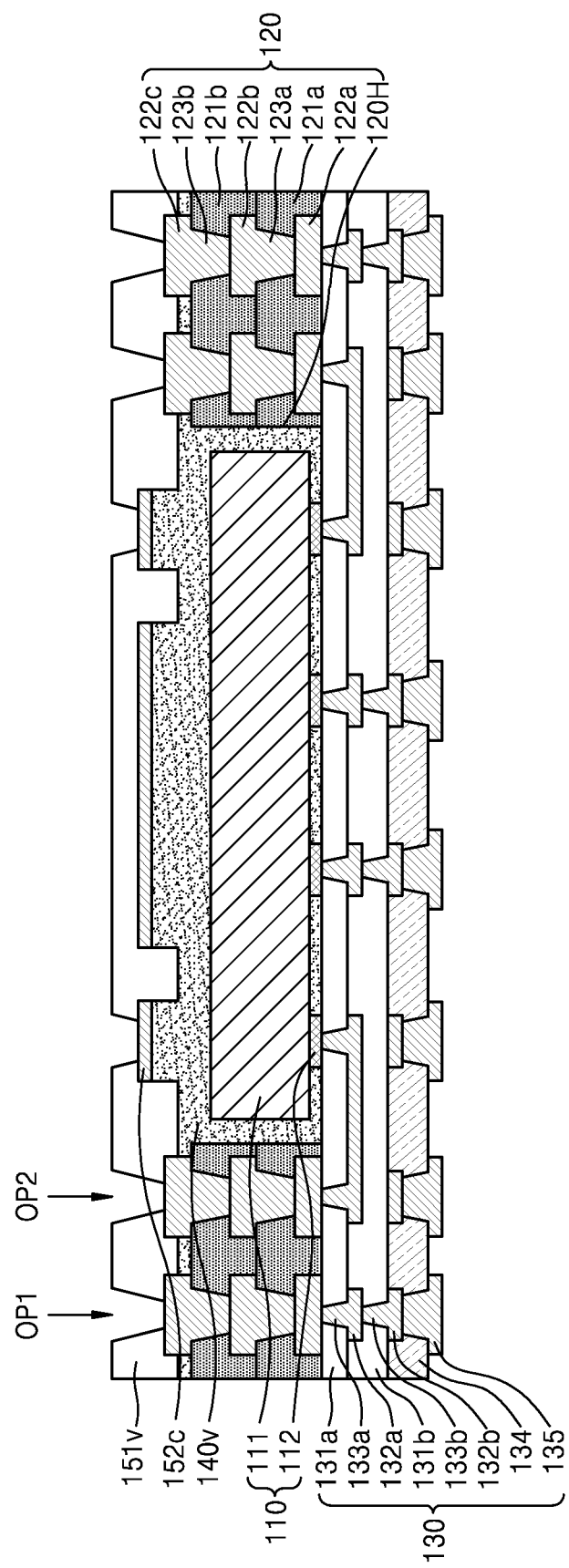

Referring to FIG. 8D, the first upper insulating layer 151v having the first opening OP1, through which the upper surface of the intermediate connection structure 120, e.g., the upper surface of the first intermediate conductive pattern layer 122c, is exposed, and a second opening OP2, through which the upper surface of the third upper conductive pattern layer 152c is exposed, may be formed For example, the first opening OP1 and the second opening OP2 may be formed by coating a liquid photosensitive insulating material on the first sealing layer 140v and the intermediate connection structure 120 and selectively exposing to light and developing the photosensitive insulating material.

Figure 8E:
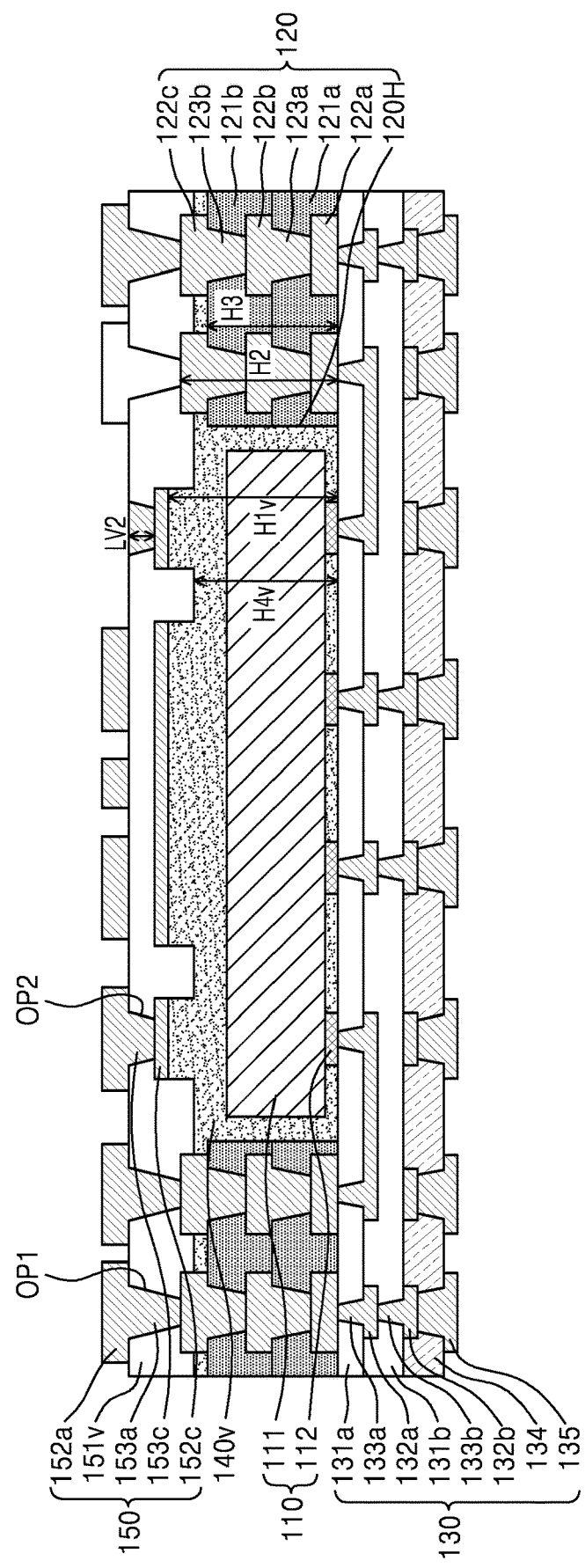

Referring to FIG. 8E, the first upper via 153a filling in the first opening OP1 of the first upper insulating layer 151a, the third upper via 153c filling in the second opening OP2 of the first upper insulating layer 151a, and the first upper conductive pattern layer 152a on the first upper insulating layer 151a may be formed. For example, the first upper via 153a, the third upper via 153c, and the first upper conductive pattern layer 152a may be formed by forming a mask pattern (not shown) on the first upper insulating layer 151v, forming a seed layer on the first upper insulating layer 151v by using sputtering, forming a filling layer on the seed layer by using plating, and removing the mask pattern. According to some embodiments of the inventive concept, the forming of the first upper via 153a, the third upper via 153c, and the first upper conductive pattern layer 152a may further include forming a wetting layer on the filling layer by using, for example, plating.

Next, as described above with reference to FIG. 1, the upper protective layer 160 may be formed on the first upper conductive pattern layer 152a and the first upper insulating layer 151v, and the external connection terminal 170 and the capacitor 180 may be attached to the lower connection structure 130. Accordingly, the semiconductor package 100D of FIG. 5 may be completed.

Referring to FIG. 6, the upper semiconductor package P2 may be formed by attaching the second semiconductor chip 210 onto the connection structure 230 and forming the second sealing layer 240 covering the connection structure 230 and the second semiconductor chip 210. In addition, the lower semiconductor package P1 may be manufactured according to the method of FIGS. 7A to 7F or the method of FIGS. 8A to 8E. The inter-package connection member 300 may be attached between the lower conductive pattern layer 232a of the connection structure 230 of the upper semiconductor package P2 and the first upper conductive pattern layer 152a of the upper connection structure 150. For example, the inter-package connection member 300 may be formed by reflowing a solder ball. Accordingly, the semiconductor package 1000 of FIG. 6 may be completed.

While the inventive concept has been particularly shown and described with reference to embodiments thereof, it will be understood that various changes in form and details may be made therein without departing from the spirit and scope of the following claims.

What is claimed is:
1. A semiconductor package comprising:
a lower connection structure;
a semiconductor chip on an upper surface of the lower connection structure;

an intermediate connection structure on the upper surface of the lower connection structure;

a sealing layer covering an upper surface of the semiconductor chip; and an upper connection structure including a first upper insulating layer on an upper surface of the sealing layer, a first upper conductive pattern layer on an upper surface of the first upper insulating layer, and a first upper via penetrating the first upper insulating layer to directly connect the first upper conductive pattern layer to the intermediate connection structure, wherein a height from the upper surface of the lower connection structure to the upper surface of the sealing layer is less than or equal to a height from the upper surface of the lower connection structure to an upper surface of the intermediate connection structure, wherein the intermediate connection structure includes a first intermediate insulating layer on the upper surface of the lower connection structure, a first intermediate conductive pattern layer on an upper surface of the first intermediate insulating layer and in contact with the first upper via, and a first intermediate via penetrating the first intermediate insulating layer to contact the first intermediate conductive pattern layer.

2. The semiconductor package of claim 1, wherein the sealing layer contacts a side surface of the first intermediate conductive pattern layer.

3. The semiconductor package of claim 1, wherein the sealing layer does not contact an upper surface of the first intermediate conductive pattern layer.

4. The semiconductor package of claim 1, wherein a height from the upper surface of the lower connection structure to an upper surface of the first intermediate conductive pattern layer is greater than a height from the upper surface of the lower connection structure to the upper surface of the first intermediate insulating layer.

5. The semiconductor package of claim 4, wherein the sealing layer at least partially fills between the upper surface of the first intermediate insulating layer and a lower surface of the first upper insulating layer.

6. The semiconductor package of claim 1, wherein the intermediate connection structure further includes;

a second intermediate insulating layer between the lower connection structure and the first intermediate insulating layer, a second intermediate conductive pattern layer between the second intermediate insulating layer and the first intermediate insulating layer and in contact with the first intermediate via, and a second intermediate via penetrating the second intermediate insulating layer to contact the second intermediate conductive pattern layer.

7. The semiconductor package of claim 1, wherein the semiconductor chip comprises a plurality of chip pads on a lower surface of the semiconductor chip.

8. The semiconductor package of claim 1, wherein the upper connection structure further includes a second upper insulating layer on the upper surface of the first upper insulating layer and an upper surface of the first upper conductive pattern layer, a second upper conductive pattern layer on an upper surface of the second upper insulating layer, and a second upper via penetrating the second upper insulating layer to extend between the second upper conductive pattern layer and the first upper conductive pattern layer.

9. The semiconductor package of claim 8, wherein at least a portion of the first upper conductive pattern layer is electrically grounded.

10. A semiconductor package comprising:

a lower semiconductor package;

an upper semiconductor package on the lower semiconductor package; and an inter-package connection member between the lower semiconductor package and the upper semiconductor package, wherein the lower semiconductor package includes a first connection structure, a first semiconductor chip on the first connection structure, a second connection structure on the first connection structure, a first sealing layer on the first semiconductor chip, and a third connection structure, the third connection structure includes an insulating layer on the first sealing layer and the second connection structure, a conductive pattern layer on the insulating layer, and a via penetrating the insulating layer and having an upper end in contact with the conductive pattern layer and a lower end in contact with the second connection structure, a length from the lower end of the via to the upper end of the via is less than or equal to a thickness of the insulating layer, the upper semiconductor package includes a fourth connection structure, a second semiconductor chip on the fourth connection structure, and a second sealing layer on the fourth connection structure and the second semiconductor chip, and the inter-package connection member connects the conductive pattern layer of the third connection structure to the fourth connection structure.

11. The semiconductor package of claim 10, wherein the first sealing layer at least partially fills between the second connection structure and the first semiconductor chip.

12. The semiconductor package of claim 10, wherein the first semiconductor chip is connected to the third connection structure through the first connection structure and the second connection structure.

13. The semiconductor package of claim 10, wherein the lower semiconductor package further includes a protective layer that exposes a part of the conductive pattern layer in contact with the inter-package connection member and covers a remaining part of the conductive pattern layer and the insulating layer.

14. The semiconductor package of claim 10, further comprising:

a capacitor on a lower surface of the first connection structure.

15. A semiconductor package comprising:

a semiconductor chip;

an intermediate connection structure including an intermediate insulating layer around the semiconductor chip, an intermediate conductive pattern layer on the intermediate insulating layer, and an intermediate via penetrating the intermediate insulating layer to connect the intermediate conductive pattern layer;

a lower connection structure including a lower insulating layer on a lower surface of the semiconductor chip and a lower surface of the intermediate connection structure, a lower via penetrating the lower insulating layer to connect the intermediate via, and a lower pad disposed on a lower surface of the lower insulating layer and connected to the lower via;

an external connection terminal on a lower surface of the lower pad;

a sealing layer covering an upper surface of the semiconductor chip and exposing the intermediate conductive pattern layer; and an upper connection structure including a first upper insulating layer on the sealing layer, a first upper conductive pattern layer on the first upper insulating layer, and a first upper via penetrating the first upper insulating layer to connect the first upper conductive pattern layer to the intermediate conductive pattern layer, wherein an upper surface of the intermediate conductive pattern layer is coplanar with an upper surface of the sealing layer or protrudes upward from the upper surface of the sealing layer.

16. The semiconductor package of claim 15, wherein the sealing layer comprises a composite material includes a matrix and a filler in the matrix.

17. The semiconductor package of claim 16, wherein the first upper insulating layer does not include a filler.

18. The semiconductor package of claim 16, wherein the filler includes a nanofiller.

19. The semiconductor package of claim 15, wherein the upper connection structure further includes a third upper conductive pattern layer between the sealing layer and the first upper insulating layer, and a third upper via penetrating the first upper insulating layer to extend between the first upper conductive pattern layer and the third upper conductive pattern layer.

* * * * *